(12) United States Patent
Terasaki et al.

(10) Patent No.: US 9,560,755 B2
(45) Date of Patent: Jan. 31, 2017

(54) BONDING BODY, POWER MODULE SUBSTRATE, AND HEAT-SINK-ATTACHED POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 14/775,137

(22) PCT Filed: Mar. 14, 2014

(86) PCT No.: PCT/JP2014/056920
§ 371 (c)(1),
(2) Date: Sep. 11, 2015

(87) PCT Pub. No.: WO2014/142310
PCT Pub. Date: Sep. 18, 2014

(65) Prior Publication Data
US 2016/0035660 A1 Feb. 4, 2016

(30) Foreign Application Priority Data

Mar. 14, 2013 (JP) .................. 2013-052408
Mar. 14, 2013 (JP) .................. 2013-052409

(51) Int. Cl.
*H05K 1/02* (2006.01)
*H05K 1/09* (2006.01)
(Continued)

(52) U.S. Cl.
CPC .............. *H05K 1/09* (2013.01); *B23K 20/026* (2013.01); *B23K 20/16* (2013.01); *B23K 20/233* (2013.01);
(Continued)

(58) Field of Classification Search
CPC .................................. H05K 1/021; H05K 1/09
See application file for complete search history.

(56) References Cited

U.S. PATENT DOCUMENTS

2005/0280498 A1 12/2005 Kikuchi et al.
2009/0286382 A1 11/2009 Huff

FOREIGN PATENT DOCUMENTS

CN 1725932 A 1/2006
CN 102403292 A 4/2012
(Continued)

OTHER PUBLICATIONS

International Search Report mailed Jun. 17, 2014, issued for PCT/JP2014/056920 and English translation thereof.
(Continued)

*Primary Examiner* — Jeremy C Norris
(74) *Attorney, Agent, or Firm* — Locke Lord LLP; James E. Armstrong, IV; Julie Tabarovsky

(57) ABSTRACT

A bonding body includes: an aluminum member composed of aluminum; and a metal member composed of any one of copper, nickel, and silver, wherein the aluminum member and the metal member are bonded together. In a bonding interface between the aluminum member and the metal member, a Ti layer and an Al—Ti—Si layer are formed, the Ti layer being disposed at the metal member side in the bonding interface, and the Al—Ti—Si layer being disposed between the Ti layer and the aluminum member and containing Si which is solid-solubilized into $Al_3Ti$. The Al—Ti—Si layer includes: a first Al—Ti—Si layer formed at the Ti layer side; and a second Al—Ti—Si layer formed at the aluminum member side and a Si concentration of which is lower than a Si concentration of the first Al—Ti—Si layer.

20 Claims, 12 Drawing Sheets

(51) Int. Cl.
| | |
|---|---|
| *B32B 15/01* | (2006.01) |
| *B23K 20/02* | (2006.01) |
| *B23K 20/16* | (2006.01) |
| *B23K 20/233* | (2006.01) |
| *C22C 13/00* | (2006.01) |
| *C22C 13/02* | (2006.01) |
| *C22C 21/00* | (2006.01) |
| *C22C 21/02* | (2006.01) |
| *H01L 23/373* | (2006.01) |
| *H01L 23/473* | (2006.01) |
| *B23K 35/00* | (2006.01) |
| *H01L 23/367* | (2006.01) |
| *H01L 23/498* | (2006.01) |

(52) U.S. Cl.
CPC ......... *B23K 35/002* (2013.01); *B23K 35/005* (2013.01); *B32B 15/01* (2013.01); *B32B 15/017* (2013.01); *C22C 13/00* (2013.01); *C22C 13/02* (2013.01); *C22C 21/00* (2013.01); *C22C 21/02* (2013.01); *H01L 23/3675* (2013.01); *H01L 23/3735* (2013.01); *H01L 23/3736* (2013.01); *H01L 23/473* (2013.01); *H01L 23/49822* (2013.01); *H01L 23/49838* (2013.01); *H01L 23/49866* (2013.01); *H05K 1/02* (2013.01); *B23K 2201/38* (2013.01); *B23K 2203/08* (2013.01); *B23K 2203/10* (2013.01); *B23K 2203/12* (2013.01); *B23K 2203/18* (2013.01); *B23K 2203/26* (2015.10); *H01L 2224/32225* (2013.01)

(56) References Cited

FOREIGN PATENT DOCUMENTS

| | | |
|---|---|---|
| JP | 06-328271 A | 11/1994 |
| JP | 3012835 B2 | 2/2000 |
| JP | 3171234 B2 | 5/2001 |
| JP | 2004-172378 A | 6/2004 |
| JP | 2008-208442 A | 9/2008 |
| JP | 2011108999 A | 6/2011 |
| JP | 2012-104539 A | 5/2012 |
| JP | 2014-087805 A | 5/2014 |

OTHER PUBLICATIONS

Office Action, dated May 24, 2016, issued for China patent application No. 201480013552.4.

BONDING BODY, POWER MODULE SUBSTRATE, AND HEAT-SINK-ATTACHED POWER MODULE SUBSTRATE

TECHNICAL FIELD

The present invention relates to a bonding body in which an aluminum member and a metal member composed of copper, nickel or silver are bonded together, a power module substrate, and a heat-sink-attached power module substrate.

The present application claims priority on Japanese Patent Application No. 2013-052408 and Japanese Patent Application No. 2013-052409, both of which were filed on Mar. 14, 2013, the content of which is incorporated herein by reference.

BACKGROUND ART

In the semiconductor device such as a power module and a LED, it has a structure in which the semiconductor element is bonded onto a circuit layer composed of a conductive material.

Since a power semiconductor device of high-power control that is used to control wind power, electric vehicles such as electric automobiles, and the like, generates a large amount of heat, as a substrate mounting the power semiconductor device, in the case where a metal plate having excellent conductivity is bonded to one surface of a ceramic substrate (insulation layer) composed of, for example AN (aluminum nitride), or two metal plates having excellent conductivity are bonded to respective surfaces of the ceramic substrate, a power module substrate in which the metal plate disposed on one surface of the ceramic substrate is used as a circuit layer and another metal plate disposed on the other surface of the ceramic substrate is used as a metal layer has been widely used conventionally.

For example, in the power module shown in Patent Document 1, it has a structure including: a power module substrate in which a circuit layer (aluminum member) composed of Al and disposed on one surface of a ceramic substrate, and a metal layer composed of Al and disposed on the other surface of the ceramic substrate are formed; and a semiconductor device bonded on the circuit layer with a solder material interposed therebetween. A heat sink is bonded to the downside of the power module substrate, and the power module is configured to transfer the heat generated by the semiconductor device to the power module substrate side and to dissipate the heat to the outside via the heat sink.

As in the power module described in the Patent Document 1, when the circuit layer is composed of Al, an oxidation coating film of Al is formed on a surface of the circuit layer, and therefore, the semiconductor device cannot be bonded by the solder material. Also, when the metal layer is composed of Al, an oxidation coating film of Al is formed on a surface of the metal layer, and therefore, the heat sink cannot be bonded by the solder material.

Conventionally, as shown in, for example, Patent Document 2, a Ni plating film is formed on each surface of a circuit layer, metal layer and heat sink by electroless plating or the like, and then, they are bonded together by a solder material.

In addition, in Patent Document 3, as an alternative technique using the solder material, a technique in which a semiconductor device, metal layer, heat sink and so on are bonded together using a silver oxide paste that includes silver oxide particles and a reducing agent containing an organic substance has been proposed.

Furthermore, in Patent Document 4, a power module in which each of a circuit layer and metal layer is formed by an Al layer and Cu layer has been proposed. In this case, since the Cu layer is disposed on each surface of the circuit layer and metal layer, a good bonding of the semiconductor device can be performed using the solder material. Also, since Cu has a large deformation resistance as compared with Al, when a heat cycle is applied on the power module, a great deformation of the surface of the circuit layer and the surface of the metal layer can be prevented, the occurrence of cracks in a solder layer is prevented, and the bonding reliability between the semiconductor device and the circuit layer and the bonding reliability between the metal layer and the heat sink can be improved.

In addition, in the power module described in Patent Document 4, a bonding body in which an Al layer and Cu layer are bonded together with a Ti layer interposed therebetween is used as the circuit layer and the metal layer. Here, a diffusion layer is formed between the Al layer and Ti layer, and the diffusion layer has an Al—Ti layer, an Al—Ti—Si layer, and an Al—Ti—Cu layer such that the Al—Ti layer, Al—Ti—Si layer, and Al—Ti—Cu layer are sequentially arranged from the Al layer.

PRIOR ART DOCUMENTS

Patent Documents

[Patent Document 1] Japanese Patent No. 3171234
[Patent Document 2] Japanese Unexamined Patent Application, First Publication No. 2004-172378
[Patent Document 3] Japanese Unexamined Patent Application, First Publication No. 2008-208442
[Patent Document 4] Japanese Patent Publication No. 3012835

DISCLOSURE OF THE INVENTION

Problems to be Solved by the Invention

As described in the Patent Document 2, in the power module substrate in which the Ni plating film is formed on the surface of the circuit layer and on the surface of the metal layer, a deterioration of the surface of the Ni plating film due to oxidation, or the like, occurs in a step that until the semiconductor device is bonded to the circuit layer and in a step that until the heat sink is bonded to the metal layer, and there was a possibility of reducing in bonding reliability between the semiconductor device and circuit layer bonded with the solder material interposed therebetween, and reducing in bonding reliability between the heat sink and metal plate bonded with the solder material interposed therebetween. Also, in order to avoid troubles such as electric corrosion that is the result of forming the Ni plating film in an undesired area, a masking treatment may be performed in the Ni plating step. In this manner, when the plating treatment is performed after performing the masking treatment, significant effort is required in the step of forming the Ni plating film on a portion of the circuit layer and on a portion of the metal layer, and thus, there is a problem in that the cost of producing the power module is increased significantly.

Furthermore, as described in the Patent Document 3, when the circuit layer and the semiconductor device are bonded together using the silver oxide paste and when the metal layer and the heat sink are bonded together using the silver oxide paste, since the bonding properties of a sintered body formed of Al and the silver oxide paste are poor, it was necessary to form an Ag underlayer on the surface of the circuit layer and on the surface of the metal layer, in advance.

In addition, in the power module described in the Patent Document 4, a hard layer such as an Al—Ti layer and Al—Ti—Cu layer is formed at a bonding interface between an Al layer and Ti layer of the circuit layer, and another hard layer such as an Al—Ti layer and Al—Ti—Cu layer is formed at a bonding interface between an Al layer and Ti layer of the metal layer. Therefore, there was a problem in that the bonding interfaces become a starting point of cracks when a heat cycle is applied.

Moreover, in the case where a Cu plate, or the like, is laminated on the Al layer with a Ti foil interposed therebetween and is heated at the temperature at which an interface between the Al layer and the Ti foil is melted, a liquid phase is generated at the bonding interface, and humps and a variation of thickness are generated. Therefore, there was a problem of reducing in the bonding reliability.

Here, as an alternative of Ni plating of the Patent Document 2, as described in the Patent Document 4, a Ni layer may be formed by bonding a Ni plate via a Ti foil on the circuit layer composed of Al and on the metal layer composed of Al. Furthermore, when the silver oxide paste of the Patent Document 3 is used, the Ag underlayer may be formed by bonding an Ag plate via the Ti foil on the circuit layer composed of Al and on the metal layer composed of Al.

However, when the Ni layer and Ag layer are formed by the method described in the Patent Document 4, as the same in the case of forming the Cu layer, there is a possibility of reducing in bonding reliability by reason of the formation of a hard layer such as an Al—Ti layer, an Al—Ti—Ni layer, and an Al—Ti—Ag layer formed at the bonding interface between the Al layer and the Ti layer, humps generated at the bonding interface, and the like.

As above, conventionally, a good bonding of the aluminum member and the metal member composed of any one of copper, nickel, and silver could not be achieved, and a bonding body having an excellent bonding reliability could not be obtained. Also, conventionally, a good bonding of the Al layer and the metal member layer composed of any one of Cu, Ni, and Ag could not be achieved, and a power module substrate having the metal layer which is excellent in bonding reliability could not be obtained.

The present invention has been made in view of the above circumstances, and the purpose thereof is to provide: a bonding body, a power module substrate, and a heat-sink-attached-power module substrate, in each of which, an aluminum member and the metal member composed of any one of copper, nickel, and silver are satisfactorily bonded together, each of which can prevent the occurrence of cracks in a bonding portion, and each of which has a good bonding reliability.

Also, in a metal layer having an Al layer and a metal member layer composed of any one of copper, nickel, and silver, the purpose the present invention is to provide: a power module substrate and a heat-sink-attached-power module substrate, in each of which the Al layer and the metal layer member are satisfactory bonded together, each of which can prevent the occurrence of cracks in a bonding portion, and each of which has a good bonding reliability.

Means for Solving the Problem

In order to solve the above problems, (1) an aspect of the present invention provides a bonding body including: an aluminum member composed of aluminum; and a metal member composed of any one of copper, nickel, and silver, wherein the aluminum member and the metal member are bonded together. In a bonding portion between the aluminum member and the metal member, a Ti layer and an Al—Ti—Si layer are formed, the Ti layer being disposed at the metal member side; and the Al—Ti—Si layer being disposed between the Ti layer and the aluminum member and containing Si which is solid-solubilized into $Al_3Ti$. The Al—Ti—Si layer includes: a first Al—Ti—Si layer formed at the Ti layer side; and a second Al—Ti—Si layer formed at the aluminum member side and a Si concentration of which is lower than a Si concentration of the first Al—Ti—Si layer.

According to the above bonding body, in the bonding interface between the aluminum member composed of aluminum and the metal member composed of any one of copper, nickel, and silver, the Ti layer and the Al—Ti—Si layer are formed, and a hard layer such as an Al—Ti—Cu layer and Al—Ti layer is not formed. Therefore, when the heat cycle is applied, the occurrence of cracks at the bonding portion is prevented and the bonding reliability between the aluminum member and the metal member can be improved.

Furthermore, since the first Al—Ti—Si layer formed at the Ti layer side has a Si concentration higher than that of the second Al—Ti—Si layer formed at the aluminum member side, the diffusion of Ti atoms toward the aluminum member is suppressed by the first Al—Ti—Si layer having a high Si concentration, the thickness of the first Al—Ti—Si layer and second Al—Ti—Si layer can be made thin, and when the heat cycle is applied, the occurrence of cracks in the bonding portion can be prevented.

In addition, in the present invention, aluminum is composed of pure aluminum or an aluminum alloy, and the metal member is composed of any one of: copper or a copper alloy; nickel or a nickel alloy; and silver or a silver alloy.

(2) Another aspect of the present invention provides the bonding body described in (1), wherein a Si concentration contained in the second Al—Ti—Si layer is 1 at % or more in the bonding body.

In this case, since the second Al—Ti—Si layer formed at the aluminum member side has a sufficient Si concentration, an excess diffusion of Al atoms composing the aluminum member toward the Ti layer can be suppressed, and the thickness of the first Al—Ti—Si layer and second Al—Ti—Si layer can be made thin.

(3) Still another aspect of the present invention provides a power module substrate including: an insulation layer; and a circuit layer formed on one surface of the insulation layer, wherein the circuit layer is formed of the bonding body described in (1) or (2). The circuit layer includes: an Al layer formed of the aluminum member and formed on one surface of the insulation layer, and a metal member layer formed of the metal member and formed on one surface of the Al layer. In a bonding portion between the Al layer and the metal member layer, a Ti layer and an Al—Ti—Si layer are formed, the Ti layer being disposed at the metal member layer side, and the Al—Ti—Si layer being disposed between the Ti layer and the Al layer and containing Si which is solid-solubilized into $Al_3Ti$. The Al—Ti—Si layer includes: a first Al—Ti—Si layer formed at the Ti layer side; and a second Al—Ti—Si layer formed at the Al layer side and a Si concentration of which is lower than a Si concentration of the first Al—Ti—Si layer.

According to the above power module substrate, in the circuit layer, in the bonding portion between the Al layer and the metal member layer, the Ti layer and the Al—Ti—Si layer are formed, and a hard layer such as an Al—Ti—Cu layer and Al—Ti layer is not formed. Therefore, when the heat cycle is applied, the occurrence of cracks in the circuit layer can be prevented. Thus, in the power module, the bonding reliability between the semiconductor device and the power module substrate can be improved.

Furthermore, since the Si concentration of the first Al—Ti—Si layer formed at the Ti layer side is higher than the Si concentration of the second Al—Ti—Si layer formed at the Al layer side, the diffusion of Ti atoms toward the Al layer is suppressed, the thickness of the first Al—Ti—Si layer and second Al—Ti—Si layer can be made thin.

In addition, in this case, since the Al layer having a relatively small deformation resistance is formed on the one surface of the insulation layer, the Al layer absorbs the thermal stress generated when the heat cycle is applied, and the occurrence of cracks in the ceramic substrate can be prevented.

Furthermore, in the case where the Cu layer composed of copper or a copper alloy is formed on one surface of the Al layer, since the Cu layer has a large deformation resistance as compared with the Al layer, when the heat cycle is applied, the deformation of the circuit layer is prevented, the deformation of the solder layer bonding the semiconductor device and the circuit layer together is prevented, and the bonding reliability can be improved. Also, since the Cu layer having a good thermal conductivity is formed at one side of the circuit layer, the heat from the semiconductor device is spread and can be efficiently transferred toward the power module substrate.

Also, in the case where a Ni layer composed of nickel or a nickel alloy is formed on the one surface of the Al layer, good soldering properties are obtained and the bonding reliability between the semiconductor device and the Ni layer improves.

Also, in the case where an Ag layer composed of silver or a silver alloy is formed on the one surface of the Al layer, since the bonding of the Ag layer and the silver which is derived by reduction of silver oxide is a bonding performed by the same type of metal when the semiconductor device is bonded by using, for example, a silver oxide paste including silver oxide particles and a reducing agent containing an organic substance, the bonding reliability can be improved. In addition, since the Ag layer having a good thermal conductivity is formed at one side of the circuit layer, the heat from the semiconductor device is spread and can be efficiently transferred toward the power module substrate.

(4) Still another aspect of the present invention provides the power module substrate described in (3), and the power module substrate further includes: a metal layer formed on the other surface of the insulation layer, wherein the metal layer is formed of the bonding body described in (1) or (2). The metal layer includes: an Al layer formed of the aluminum member and formed on the other surface of the insulation layer, and a metal member layer formed on a surface of the Al layer that is opposite to a surface of the Al layer on which the insulation layer is formed, and formed of the metal member. In a bonding portion between the Al layer and the metal member layer, a Ti layer and an Al—Ti—Si layer are formed, the Ti layer being disposed at the metal member layer side, and the Al—Ti—Si layer being disposed between the Ti layer and the Al layer and containing Si which is solid-solubilized into $Al_3Ti$. The Al—Ti—Si layer includes: a first Al—Ti—Si layer formed at the Ti layer side; and a second Al—Ti—Si layer formed at the Al layer side and a Si concentration of which is lower than a Si concentration of the first Al—Ti—Si layer.

In this case, in the metal layer, in the bonding portion between the Al layer and the metal member layer, the Ti layer and the first Al—Ti—Si layer are formed, and a hard layer such as an Al—Ti—Cu layer and Al—Ti layer is not formed. Therefore, when the heat cycle is applied, the occurrence of cracks in the metal layer can be prevented. Thus, when the metal layer and the heat sink are bonded together, the bonding reliability between the metal layer and the heat sink can be improved.

(5) Still another aspect of the present invention provides a power module substrate including: an insulation layer; a circuit layer formed on one surface of the insulation layer; and a metal layer formed on the other surface of the insulation layer, wherein the metal layer is formed of the bonding body described in (1) or (2). In a bonding portion between an Al layer formed of the aluminum member and a metal member layer formed of the metal member, a Ti layer and an Al—Ti—Si layer are formed, the Ti layer being disposed at the metal member layer side, and the Al—Ti—Si layer being disposed between the Ti layer and the Al layer and containing Si which is solid-solubilized into $Al_3Ti$. The Al—Ti—Si layer includes: a first Al—Ti—Si layer formed at the Ti side; and a second Al—Ti—Si layer formed at the Al layer side and a Si concentration of which is lower than a Si concentration of the first Al—Ti—Si layer.

In addition, in the present invention, aluminum is composed of pure aluminum or an aluminum alloy, copper is composed of pure copper or a copper alloy, nickel is composed of pure nickel or a nickel alloy, and silver is composed of pure silver or a silver alloy.

According to the above power module substrate, in the metal layer, in the bonding interface between the Al layer and the metal member layer, the Ti layer and the Al—Ti—Si layer are formed, and a hard layer such as an Al—Ti—Cu layer and Al—Ti layer is not formed. Therefore, when the heat cycle is applied, the occurrence of cracks in the metal layer can be prevented. Thus, when the metal layer of the power module substrate is bonded to the heat sink, the bonding reliability between the power module substrate and the heat sink can be improved.

Furthermore, since the Si concentration of the first Al—Ti—Si layer formed at the Ti layer side is higher than the Si concentration of the second Al—Ti—Si layer formed at the Al layer side, the diffusion of Ti atoms toward the Al layer is suppressed, the thickness of the first Al—Ti—Si layer and second Al—Ti—Si layer can be made thin.

Also, in this case, since the Al layer having a relatively small deformation resistance is formed on the other surface of the insulation layer, the Al layer absorbs the thermal stress generated when the heat cycle is applied, and the occurrence of cracks in the ceramic substrate is suppressed.

Furthermore, in the case where the Cu layer composed of copper or a copper alloy is formed on a surface of the Al layer that is opposite to a surface of the Al layer on which the insulation layer is formed, since the Cu layer has a large deformation resistance as compared with the Al layer, when the heat cycle is applied, the deformation of the metal layer is suppressed and the deformation of a bonding layer in which the heat sink and the metal layer are bonded together is suppressed, and thus, the bonding reliability can be improved.

Also, in the case where a Ni layer composed of nickel or a nickel alloy is formed on a surface of the Al layer that is opposite to the surface of the Al layer on which the insulation layer is formed, good soldering properties are obtained and the bonding reliability of the heat sink and the Ni layer is improved.

Also, in the case where an Ag layer composed of silver or a silver alloy is formed on a surface of the Al layer that is opposite to a surface of the Al layer on which the insulation layer is formed, since the bonding of the Ag layer and the silver which is derived by reduction of silver oxide is a bonding performed by the same type of metal when the heat sink is bonded using, for example, a silver oxide paste including an silver oxide particles and a reducing agent containing an organic substance, the bonding reliability can be improved.

(6) Still another aspect of the present invention provides a heat-sink-attached power module substrate including: the power module substrate described in any one of (3) to (5), and a heat sink bonded to the metal layer.

According to the above heat-sink-attached power module substrate, since the power module substrate and the heat sink are bonded together, the heat from the power module substrate can be efficiently dissipated via the heat sink.

(7) Still another aspect of the present invention provides the heat-sink-attached power module substrate described in (6), and the metal layer and the heat sink are bonded together through a solder layer.

In this case, since a metal member layer that is composed of copper, nickel or silver and is formed at a side close to the heat sink in the metal layer and the heat sink are bonded together through the solder layer, the metal member layer and the solder layer are satisfactorily bonded together and the bonding reliability between the metal layer and the heat sink can be improved.

(8) Still another aspect of the present invention provides a heat-sink-attached power module substrate including: an insulation layer; and a circuit layer formed on one surface of the insulation layer, a metal layer formed on the other surface of the insulation layer, and a heat sink bonded on the metal layer, wherein the metal layer and the heat sink are formed of the bonding body described in (1) or (2). One of the metal layer and the heat sink of the bonding body is formed of aluminum, and the other of the metal layer and the heat sink of the bonding body is formed of any one of copper, nickel and silver. In a bonding portion between the metal layer and the heat sink, a Ti layer and an Al—Ti—Si layer are formed, the Ti layer being disposed at the metal layer side when the metal layer of the bonding body is formed of any one of copper, nickel and silver or being disposed at the heat sink side when the heat sink of the bonding body is formed of any one of copper, nickel and silver, and the Al—Ti—Si layer being disposed between the Ti layer and the metal layer when the metal layer of the bonding body is composed of aluminum or being disposed between the Ti layer and the heat sink when the heat sink of the bonding body is composed of aluminum, and containing Si which is solid-solubilized into $Al_3Ti$. The Al—Ti—Si layer includes: a first Al—Ti—Si layer formed at the Ti side; and a second Al—Ti—Si layer formed at the metal layer side when the metal layer of the bonding body is composed of aluminum or formed at the heat sink side when the heat sink of the bonding body is composed of aluminum, and a Si concentration of which is lower than a Si concentration of the first Al—Ti—Si layer.

According to the above heat-sink-attached-power module substrate, in the bonding portion between the metal layer and the heat sink, the Ti layer and the Al—Ti—Si layer are formed, and a hard layer such as an Al—Ti—Cu layer and Al—Ti layer is not formed. Therefore, when the heat cycle is applied, the occurrence of cracks in the bonding portion between the metal layer and the heat sink can be prevented, and the bonding reliability can be improved.

Effects of the Invention

The present invention provides a bonding body, a power module substrate, and a heat-sink-attached-power module substrate, in each of which, an aluminum member (Al layer) and a metal member (metal member layer) composed of any one of copper, nickel, and silver are satisfactorily bonded together, each of which can prevent the occurrence of cracks in the bonding portion between the aluminum member and metal member, and each of which has a good bonding reliability.

EMBODIMENTS OF THE INVENTION

First Embodiment

Embodiments of the present invention will be explained below with reference to the accompanying drawings. First, a first embodiment of the present invention is explained.

Figure 1:
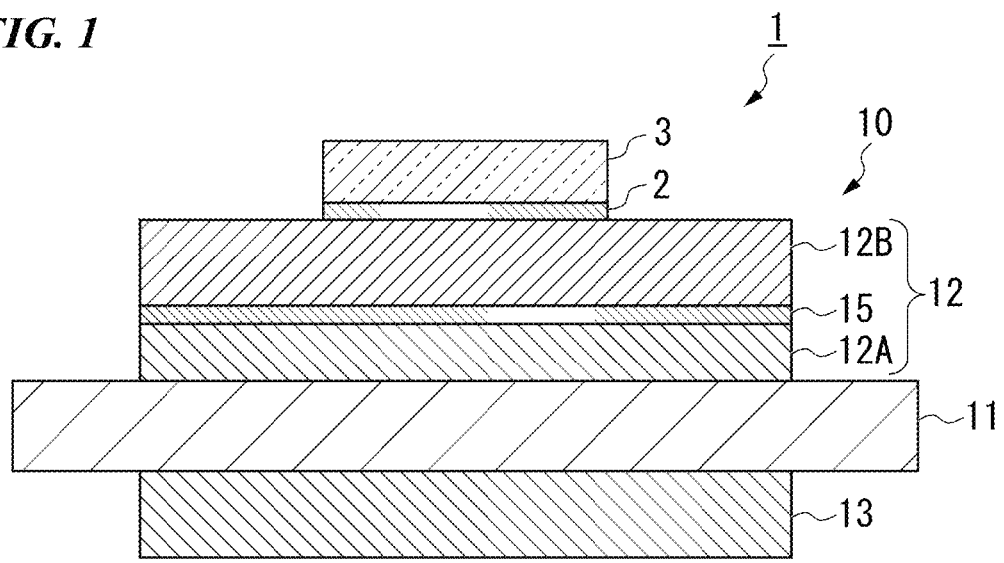
FIG. 1 is a schematic explanatory diagram of a power module according to a first embodiment of the present invention.

A power module 1 according to the first embodiment of the present invention is shown in FIG. 1.

The power module 1 includes the power module substrate 10 and a semiconductor device 3 bonded to one surface (upper surface in FIG. 1) of the power module substrate 10 with a solder layer 2 interposed therebetween.

The power module substrate 10 includes; a ceramic substrate 11 constituting an insulation layer, a circuit layer 12 (bonding body) arranged on one surface (upper surface in FIG. 1 and first surface) of the ceramic substrate 11, and a metal layer 13 arranged on the other surface (second surface) of the ceramic substrate 11.

The ceramic substrate 11 is composed of AlN (aluminum nitride), $Si_3N_4$ (silicon nitride), $Al_2O_3$ (alumina), or the like, each of which has high insulation properties. In the present embodiment, it is composed of AlN which is excellent in heat dissipation properties. The thickness of the ceramic substrate 11 is set to be in a range of 0.2 to 1.5 mm, and in the present embodiment, the thickness thereof is set to 0.635 mm.

As shown in FIG. 1, the circuit layer 12 includes an Al layer 12A arranged on the first surface of the ceramic substrate 11, and a Cu layer 12A (copper member layer) laminated on one surface of the Al layer 12A with a Ti layer 15 interposed therebetween.

The Al layer 12A is formed by bonding an aluminum plate (aluminum member) composed of aluminum or an aluminum alloy on the first surface of the ceramic substrate 11. In the present embodiment, the Al layer 12A is formed by bonding a rolled sheet of aluminum having a purity of 99% by mass or more (so-called 2N aluminum). The rolled sheet of aluminum having a purity of 99% by mass or more preferably contains Si of 0.08 to 0.95% by mass. In addition, the thickness of the aluminum plate is set to be in a range of 0.1 to 1.0 mm, and in the present embodiment, the thickness thereof is set to 0.4 mm.

The copper layer 12B is formed by bonding a copper plate (metal member) composed of copper or a copper alloy on one surface (upper surface in FIG. 1) of the Al layer 12A with the Ti layer 15 interposed therebetween. In the present embodiment, the copper layer 12B is formed by bonding a rolled sheet of an oxygen-free copper to the Al layer 12A by solid phase diffusion bonding with Ti foil interposed therebetween. In addition, the thickness of the copper plate that will be bonded is set to be in a range of 0.1 to 6.0 mm, and in the present embodiment, the thickness thereof is set to 1.0 mm.

The Ti layer 15 is formed by laminating the Al layer 12A and the copper plate with titanium foil interposed therebetween and bonding by solid phase diffusion bonding. Here, the titanium foil has a purity of 99% or more. In addition, the thickness of the titanium foil is set to 3 to 40 μm, and in the present embodiment, the thickness thereof is 10 μm.

Figure 2:
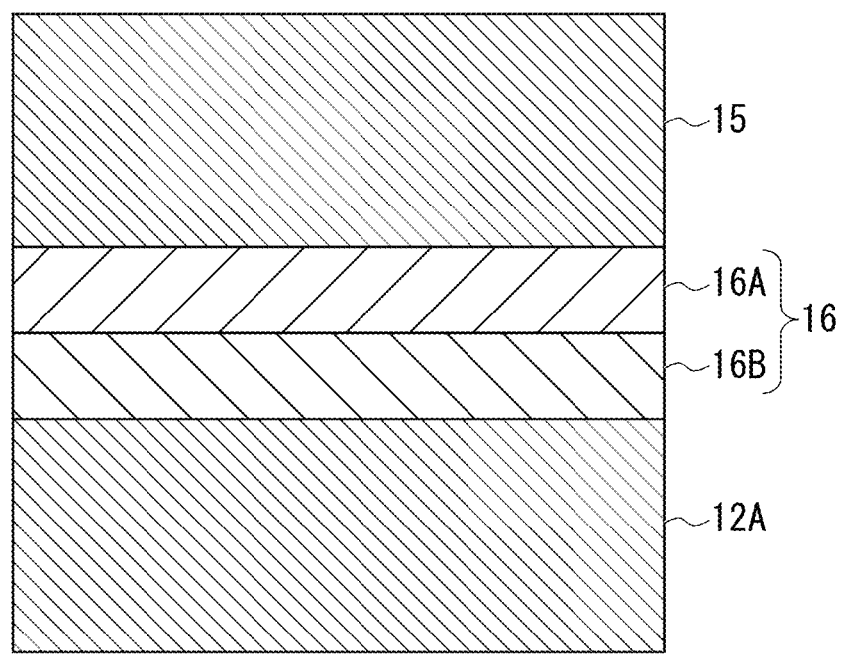
FIG. 2 is an enlarged view of a bonding interface between an Al layer and a Ti layer in FIG. 1.

As shown in FIG. 2, at a bonding interface between the Al layer 12A and the Ti layer 15, an Al—Ti—Si layer 16 in which Si is solid-solubilized into $Al_3Ti$ is formed.

The Al—Ti—Si layer 16 is formed by interdiffusion of Al atoms in the Al layer 12A and Ti atoms in the Ti layer 15. The thickness of the Al—Ti—Si layer 16 is set to 0.5 to 10 μm, and in the present embodiment, the thickness thereof is 3 μm.

As shown in FIG. 2, the Al—Ti—Si layer 16 includes a first Al—Ti—Si layer 16A formed at the Ti layer 15 side and a second Al—Ti—Si layer 16B formed at the Al layer 12A side. That is, in the bonding portion between the Al layer 12A and the Cu layer 12B, the Ti layer 15, the first Al—Ti—Si layer 16A, and the second Al—Ti—Si layer 16B are formed.

These first Al—Ti—Si layer 16A and second Al—Ti—Si layer 16B are formed of an Al—Ti—Si phase in which Si is solid-solubilized into $Al_3Ti$, the Si concentration of the second Al—Ti—Si layer 16B is lower than that of the first Al—Ti—Si layer 16A. In addition, in the present embodiment, Si contained in the first Al—Ti—Si layer 16A and second Al—Ti—Si layer 16B is the Si that is contained in the rolled sheet of 2N aluminum as impurities, and diffused into the Al—Ti—Si layer 16 and condensed therein.

The Si concentration of the first Al—Ti—Si layer 16A is 10 to 30 at %, and in the present embodiment, the Si concentration thereof is 20 at %. The Si concentration of the second Al—Ti—Si layer 16B is 1 to 10 at %, and in the present embodiment, the Si concentration thereof is 3 at %.

The metal layer 13 is formed by bonding an aluminum plate composed of aluminum or an aluminum alloy on the second surface (lower surface in FIG. 1) of the ceramic substrate 11. In the present embodiment, the metal layer 13 is formed by bonding a rolled sheet of aluminum having a purity of 99% by mass or more (so-called 2N aluminum) to the ceramic substrate 11. In addition, the thickness of the aluminum plate that will be the metal layer 13 is set to be in a range of 0.1 to 3.0 mm, and in the present embodiment, the thickness thereof is set to 1.6 mm.

The semiconductor device 3 is configured of a semiconductor material such as Si. The semiconductor device 3 and the circuit layer 12 are bonded together with the solder layer 2 interposed therebetween.

The solder layer 2 is, for example, a Sn—Ag-based, Sn—Cu-based, Sn—In-based, or Sn—Ag—Cu-based solder material (so-called lead-free solder material), and it bonds the power module substrate 10 and the semiconductor device 3 together.

Figure 3:
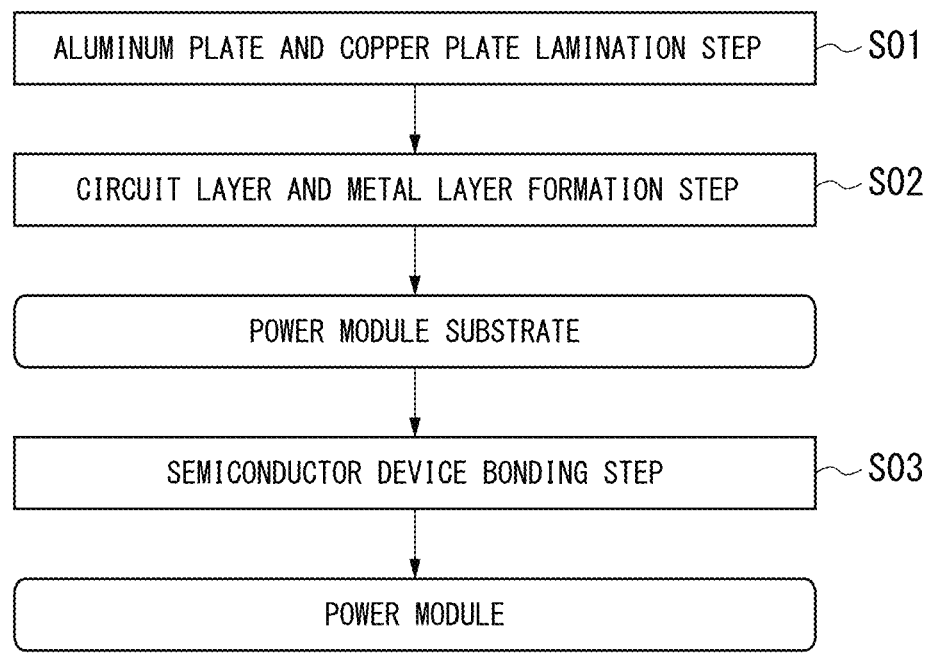
FIG. 3 is a flow chart explaining a production method of a power module according to the first embodiment of the present invention.

Next, a production method of the power module 1 according to the present embodiment will be explained with reference to FIGS. 3 and 4.

Figure 4:
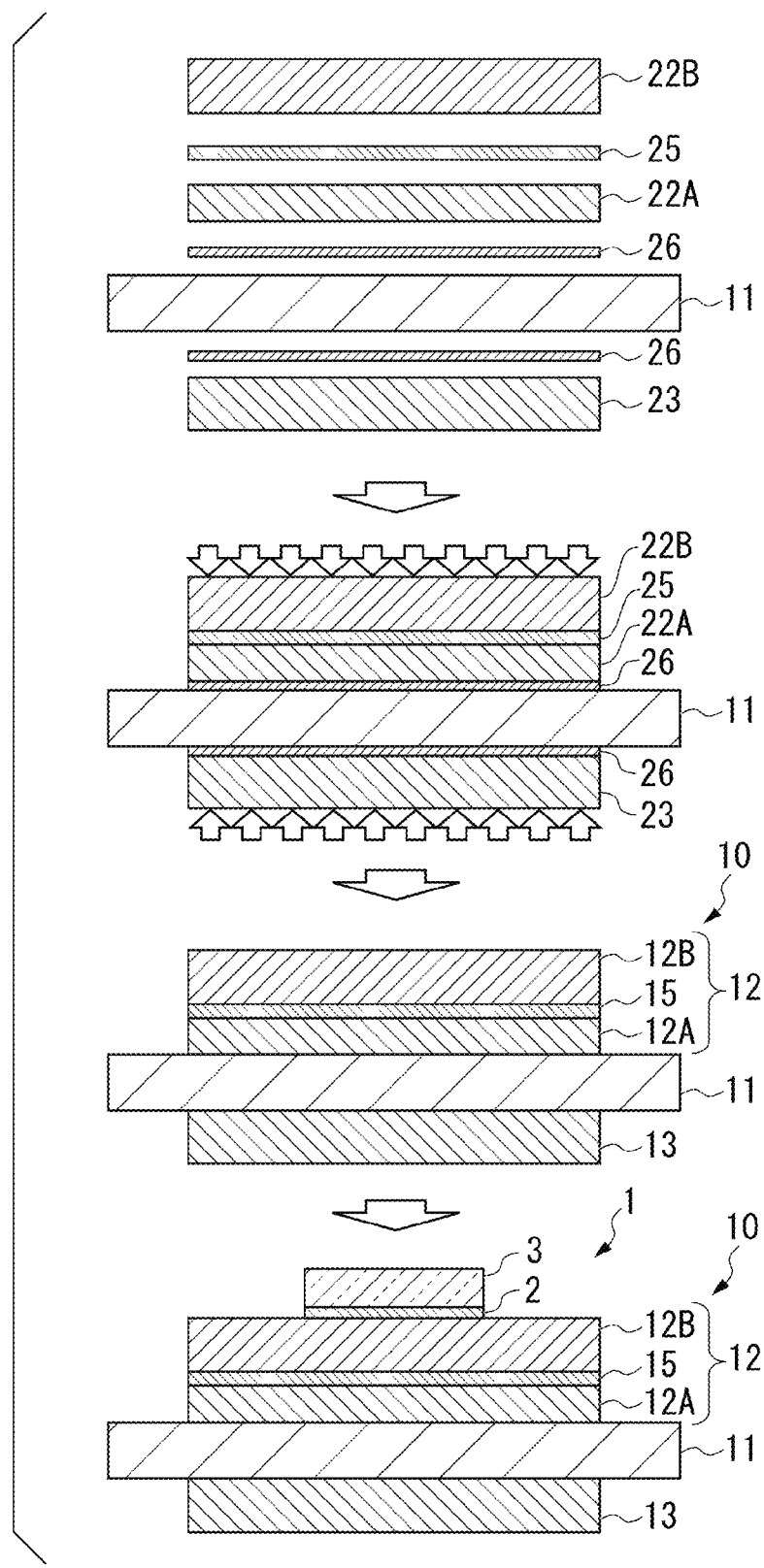
FIG. 4 is a schematic explanatory diagram of a production method of the power module according to the first embodiment of the present invention.

First, as shown in FIG. 4, an aluminum plate 22A that will be the Al layer 12A is laminated on the first surface of the ceramic substrate 11, and a copper plate 22B that will be the Cu layer 12B is laminated further thereon with a titanium foil 25 interposed between the aluminum plate 22A and copper plate 22B. On the second surface of the ceramic substrate 11, an aluminum plate 23 that will be the metal layer 13 is laminated (aluminum plate and copper plate lamination step S01). Here, in the present embodiment, the aluminum plates 22A, 23 and the ceramic substrate 11 are laminated with an Al—Si-based brazing filler metal 26 interposed between the aluminum plate 22A and ceramic substrate 11 and between the aluminum plate 23 and ceramic substrate 11.

Next, the laminated body is placed in a vacuum heating furnace in a state of being pressurized (at a pressure of 1 to 35 kgf/cm$^2$) in a lamination direction, and the Al layer 12A and the metal layer 13 are formed. Also, the Al layer 12A and the titanium foil 25 are bonded by solid phase diffusion bonding and the copper plate 22B and the titanium foil 25 are bonded by solid phase diffusion bonding, and the circuit layer 12 and the metal layer 13 are formed (circuit layer and metal layer formation step S02).

Here, the pressure in the vacuum heating furnace is preferably set to a range of $10^{-6}$ to $10^{-3}$ Pa, the heating temperature therein is preferably set to 600 to 643° C., and the retention time is preferably set to a range of 30 to 180 minutes. The more preferable heating temperature is in a range of 630 to 643° C. In the present embodiment, it was performed in the conditions of a pressure of 12 kgf/cm² pressured in the lamination direction, a heating temperature of 640° C., and a retention time of 60 minutes.

In addition, each of the surfaces of the aluminum plate 22A, the titanium foil 25, and the copper plate 22B, which will be bonded, is smoothed in advance by removing scratches thereon, and then, solid phase diffusion bonding is performed.

In the above manner, the power module substrate 10 according to the present embodiment is produced.

Next, the semiconductor device 3 is laminated on one surface (a surface) of the circuit layer 12 with the solder material interposed therebetween, and solder joint is performed in a reduction furnace (semiconductor device bonding step S03).

In the above manner, the power module 1 according to the present embodiment is produced.

According to the power module 1 and the power module substrate 10 according to the present embodiment configured as above, in the bonding portion of the circuit layer 12 between the Al layer 12A and the Cu layer 12B, the Ti layer 15 and the Al—Ti—Si layer 16 are formed, and a hard layer such as an Al—Ti—Cu layer and Al—Ti layer is not formed. Therefore, when a heat cycle is applied, the occurrence of cracks in the circuit layer 12 can be prevented. Thus, in the power module 1, the bonding reliability between the semiconductor device 3 and the power module substrate 10 can be improved.

Furthermore, since the Si concentration of the first Al—Ti—Si layer 16A formed at the Ti layer 15 side is higher than the Si concentration of the second Al—Ti—Si layer 16B formed at the Al layer 12A side, the diffusion of Ti atoms toward the Al layer 12A is suppressed by the first Al—Ti—Si layer 16A having a high Si concentration, and the thickness of the Al—Ti—Si layer 16 can be made thin. Accordingly, by the result of making thin the thickness of the Al—Ti—Si layer 16, when the heat cycle is applied, the occurrence of cracks in the bonding portion between the Al layer 12A and the Cu layer 12B can be prevented.

Also, since the Si concentration contained in the second Al—Ti—Si layer 16B formed at the Al layer 12A side is 1 to 10 at %, an excess diffusion of Al atoms toward the Ti layer 15 can be suppressed, and the thickness of the second Al—Ti—Si layer 16B can be made thin.

Moreover, since the Si concentration contained in the first Al—Ti—Si layer 16A formed at the Ti layer 15 side is 10 to 30 at %, an excess diffusion of Ti atoms toward the Al layer 12A can be suppressed, and the thickness of the first Al—Ti—Si layer 16A can be made thin.

Also, in the present embodiment, since the aluminum plate 22A, the titanium foil 25, the copper plate 22B, and the aluminum plate 23 are bonded at one time on the first surface and second surface of the ceramic substrate 11, the production process can facilitate and the production cost can be reduced.

In addition, since the Al layer 12A having a relatively small deformation resistance is formed on the first surface of the ceramic substrate 11, the Al layer 12A absorbs the thermal stress generated when the heat cycle is applied, and the occurrence of cracks in the ceramic substrate 11 can be prevented.

Furthermore, since the Cu layer 12B having a relatively large deformation resistance is formed on the one surface of the Al layer 12A, the deformation of the circuit layer 12 is suppressed when the heat cycle is applied, the deformation of a solder layer 2 that bonds the semiconductor device 3 and the circuit layer 12 together is suppressed, and the bonding reliability can be improved.

Also, since the Cu layer 12B having a good thermal conductivity is formed to one side of the circuit layer 12, the heat from the semiconductor device 3 is spread and can be efficiently transferred toward the power module substrate 10.

In the present embodiment, the solid phase diffusion bonding between the Al layer 12A (aluminum plate 22A) and the titanium foil 25 and between the copper plate 22B and the titanium foil 25 is performed in the conditions of pressurizing at a pressure of 1 to 35 kgf/cm² in the lamination direction and retaining at a temperature of 600 to 643° C., a liquid phase is not generated at an interface between the Al layer and the Ti layer, Ti atoms are diffused into the Al layer 12A and the copper plate 22B, solid phase diffusion bonding is performed by a solid phase diffusion of Al atoms and Cu atoms diffused into the titanium foil 25, and the Al layer 12A, the titanium foil 25, and the copper plate 22B can be reliably bonded together.

In a case where a pressure applied to the laminated body in the lamination direction is less than 1 kgf/cm² in performing of solid phase diffusion bonding, a sufficient bonding of the Al layer 12A, the titanium foil 25, and the copper plate 22B together becomes difficult, and a gap may cause at the bonding interfaces. In addition, in a case where a pressure applied thereto exceeds 35 kgf/cm², since the applied pressure is too high, cracks may occur in the ceramic substrate 11. For such reasons, the applied pressure in performing of solid phase diffusion bonding is set to the above range.

In a case where the temperature in performing of solid phase diffusion bonding is 600° C. or more, the diffusion of Al atoms, Ti atoms, and Cu atoms are promoted, and sufficient solid phase diffusion can be performed in a short amount of time. In addition, in a case where the temperature is 643° C. or less, a generation of humps at the bonding interfaces by a generation of a liquid phase caused by melting of aluminum; and a thickness variation, can be suppressed. Thus, the preferable temperature of solid phase diffusion bonding is set to the above range.

In addition, in a case where there are scratches on the surface on which bonding will be performed when solid phase diffusion bonding is performed, a gap may occur when solid phase diffusion bonding is performed. However, in the present embodiment, each of the surfaces of the aluminum plate 22A, the copper plate 22B, and the titanium foil 25, which will be bonded, is smoothed in advance by removing scratches thereon, and then, solid phase diffusion bonding is performed. Therefore, the generation of gaps at each of the bonding interfaces is suppressed and bonding can be performed.

Second Embodiment

Next, a second embodiment of the present invention will be explained. In addition, with respect to the same configurations as the first embodiment, the same reference numerals are used and the detail explanations thereof are omitted.

Figure 5:
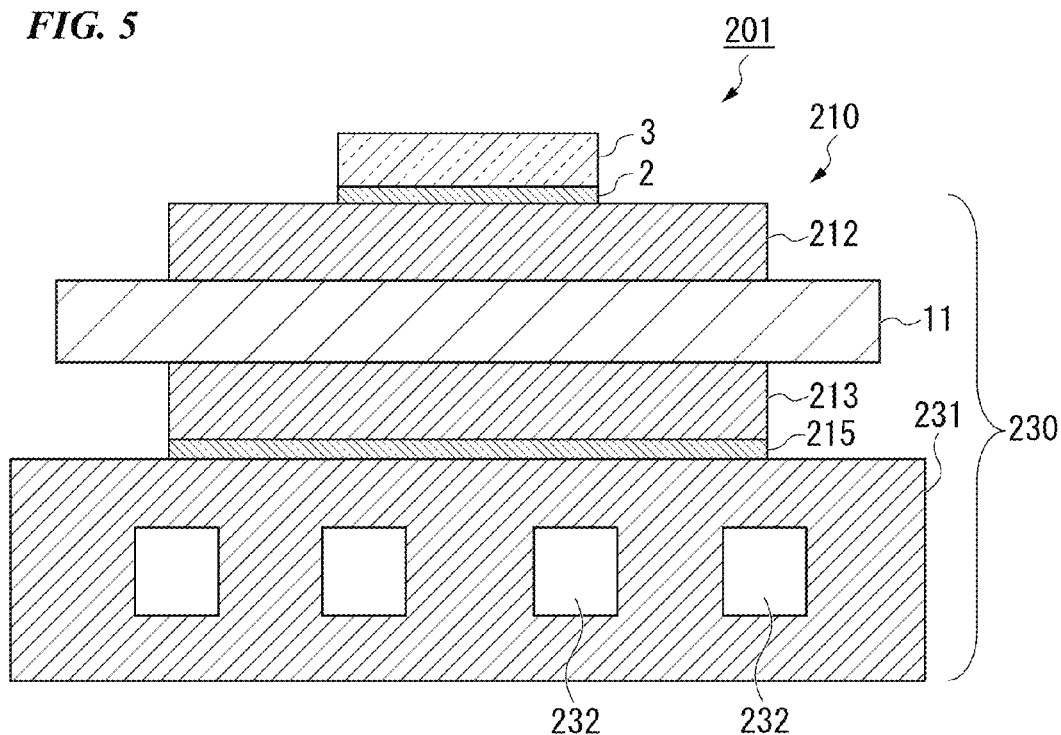
FIG. 5 is a schematic explanatory diagram of a heat-sink-attached-power module according to a second embodiment of the present invention.

A heat-sink-attached-power module 201 according to the second embodiment of the present invention is shown in FIG. 5. The heat-sink-attached-power module 201 includes a heat-sink-attached-power module substrate 230, and a semiconductor device 3 bonded to one surface (upper surface in FIG. 5) of the heat-sink-attached-power module substrate 230 with a solder layer 2 interposed therebetween.

The heat-sink-attached-power module substrate 230 includes a power module substrate 210, and a heat sink 231 (metal member) laminated to a lower side of the power module substrate 210 with a Ti layer 215 interposed therebetween.

As shown in FIG. 5, the power module substrate 210 includes: a ceramic substrate 11, a circuit layer 212 arranged on a first surface (upper surface in FIG. 5) of the ceramic substrate 11, and a metal layer 213 (Al layer) arranged on a second surface (lower surface in FIG. 5) of the ceramic substrate 11.

The circuit layer 212 is formed by bonding an aluminum plate having an electrical conductivity on the first surface (upper surface in FIG. 5) of the ceramic substrate 11. In the present embodiment, the circuit layer 212 is formed by bonding a rolled sheet of aluminum having a purity of 99.99% by mass or more (so-called 4N aluminum) to the ceramic substrate 11. In addition, the thickness of the aluminum plate that will be bonded is set in the range of 0.1 to 1.0 mm, and in the present embodiment, the thickness thereof is set to 0.6 mm.

The metal layer 213 is formed by bonding an aluminum plate composed of aluminum or an aluminum alloy, each of which has an electrical conductivity, on the second surface (lower surface in FIG. 5) of the ceramic substrate 11. In the present embodiment, the metal layer 213 is formed by bonding a rolled sheet of aluminum having a purity of 99% by mass or more (so-called 2N aluminum). The rolled sheet of aluminum having a purity of 99% by mass or more preferably contains Si of 0.08 to 0.95% by mass. In addition, the thickness of the aluminum plate is set in the range of 0.1 to 3.0 mm, and in the present embodiment, the thickness thereof is set to 0.6 mm.

A heat sink 231 dissipates the heat of the power module substrate 210 side. The heat sink 231 is composed of copper or a copper alloy, and in the present embodiment, it is composed of oxygen-free copper. In the heat sink 231, a flow path 232 through which a fluid for cooling flows is provided.

In addition, the metal layer 213 and the heat sink 231 are bonded together with the Ti layer 215 interposed therebetween.

The Ti layer 215 is formed by laminating the metal layer 213 formed of aluminum and the heat sink 231 made of copper with a titanium foil interposed therebetween and bonding by solid phase diffusion bonding. Here, the titanium foil has a purity of 99% or more. In addition, the thickness of the titanium foil is set to 3 to 40 jam, and in the present embodiment, the thickness thereof is 10 μm.

Figure 6:
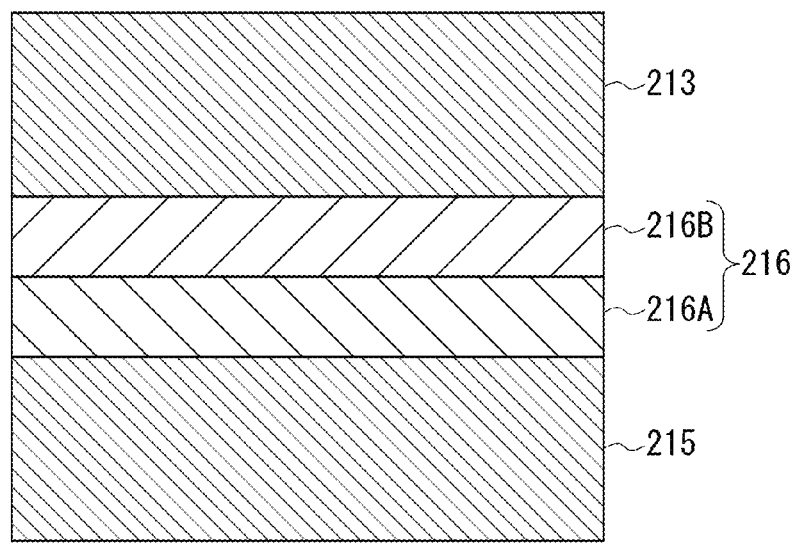
FIG. 6 is an enlarged view of a bonding interface between a metal layer and a Ti layer in FIG. 5.

As shown in FIG. 6, at a bonding interface between the metal layer 213 and the Ti layer 215, an Al—Ti—Si layer 216 in which Si is solid-solubilized into $Al_3Ti$ is formed.

The Al—Ti—Si layer 216 is formed by interdiffusion of Al atoms in the metal layer 213 and Ti atoms in the Ti layer 215. The thickness of the Al—Ti—Si layer 216 is set to 0.5 to 10 μm, and in the present embodiment, the thickness thereof is 3 μm. As shown in FIG. 6, the Al—Ti—Si layer 216 includes a first Al—Ti—Si layer 216A formed at the Ti layer 215 side and a second Al—Ti—Si layer 216B formed at the metal layer 213 side. That is, in the bonding portion between the metal layer 213 and the heat sink 231, the Ti layer 215, the first Al—Ti—Si layer 216A, and the second Al—Ti—Si layer 216B are formed.

These first Al—Ti—Si layer 216A and second Al—Ti—Si layer 216B are formed of an Al—Ti—Si phase in which Si is solid-solubilized into $Al_3Ti$, the Si concentration of the second Al—Ti—Si layer 216B is lower than that of the first Al—Ti—Si layer 216A.

The Si concentration of the first Al—Ti—Si layer 216A is 10 to 30 at %, and in the present embodiment, the Si concentration thereof is 20 at %. The Si concentration of the second Al—Ti—Si layer 216B is 1 to 10 at %, and in the present embodiment, the Si concentration thereof is 3 at %.

Figure 7:
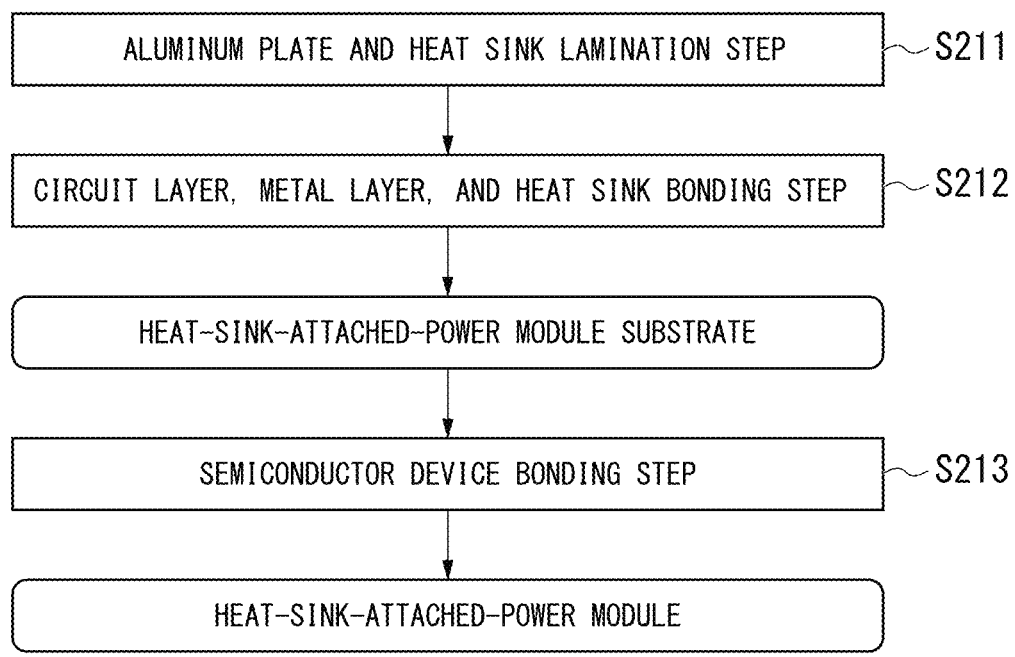
FIG. 7 is a flow chart explaining a production method of a heat-sink-attached-power module according to the second embodiment of the present invention.

Next, a production method of the heat-sink-attached-power module 201 and the heat-sink-attached-power module substrate 230 according to the present embodiment will be explained with reference to FIG. 7 and FIG. 8.

Figure 8:
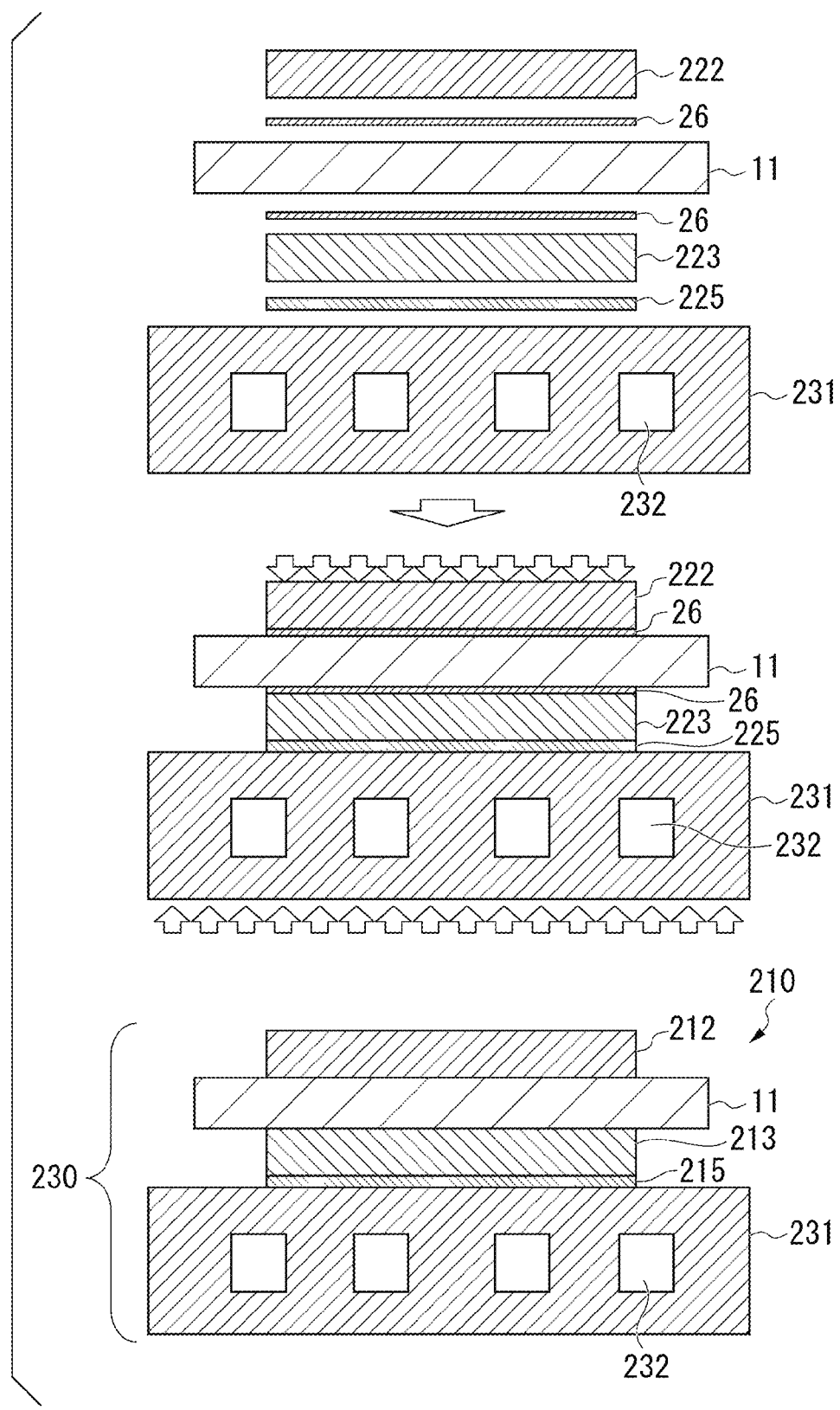
FIG. 8 is a schematic explanatory diagram of a producing method of the heat-sink-attached-power module according to the second embodiment of the present invention.

First, as shown in FIG. 8, an aluminum plate 222 that will be the circuit layer 212 is laminated on the first surface of the ceramic substrate 11 with an Al—Si based brazing filler metal foil 26 interposed therebetween. Also, an aluminum plate 223 that will be the metal layer 213 is laminated on the second surface of the ceramic substrate 11 with an Al—Si based brazing filler metal foil 26 interposed therebetween. The heat sink 231 is laminated to the second surface side (lower side in FIG. 8) of the ceramic substrate 11 with a titanium foil 225 interposed therebetween (aluminum plate and heat sink lamination step S211).

Next, the laminated body is placed in a vacuum heating furnace in a state of being pressurized (at a pressure of 1 to 35 $kgf/cm^2$) in a lamination direction of the aluminum plates 222 and 223, the ceramic substrate 11, and the heat sink 231, and the circuit layer 212 and the metal layer 213 are respectively formed on the first surface and the second surface of the ceramic substrate 11. Also, the metal layer 213 and the titanium foil 225 are bonded by solid phase diffusion bonding and the heat sink 231 and the titanium foil 225 are bonded by solid phase diffusion bonding, and the metal layer 213 and the heat sink 231 are bonded together (circuit layer, metal layer, heat sink bonding step S212).

Here, the pressure in the vacuum heating furnace is preferably set to a range of $10^{-6}$ to $10^{-3}$ Pa, the heating temperature therein is preferably set to 600 to 643° C., and the retention time is preferably set to a range of 30 to 180 minutes. The more preferable heating temperature is in a range of 630 to 643° C. In the present embodiment, it was performed in the conditions of a pressure of 20 $kgf/cm^2$ pressured in the lamination direction, a heating temperature of 640° C., and a retention time of 60 minutes.

In addition, each of the surfaces of the aluminum plate 223, the titanium foil 225, and the heat sink 231, which will be bonded, is smoothed in advance by removing scratches thereon, and then, solid phase diffusion bonding is performed.

In the above manner, the heat-sink-attached-power module substrate 230 and the power module substrate 210 according to the present embodiment can be obtained.

Next, the semiconductor device 3 is laminated on one surface of the heat-sink-attached-power module substrate 230 (circuit layer 212) with the solder material interposed therebetween, and solder joint is performed in a reduction furnace (semiconductor device bonding step S213).

In the above manner, the heat-sink-attached-power module 201 according to the present embodiment is produced.

According to the heat-sink-attached-power module 201 and the heat-sink-attached-power module substrate 230 according to the present embodiment configured as above, in the bonding portion between the metal layer 213 and the heat sink 231, the Ti layer 215, the Al—Ti—Si layer 216 are formed, and a hard layer such as an Al—Ti—Cu layer and Al—Ti layer is not formed. Therefore, when the heat cycle is applied, the occurrence of cracks in the bonding portion between the metal layer 213 and the heat sink 231 can be prevented. Thus, in the heat-sink-attached-power module 201, the bonding reliability between the metal layer 213 and the heat sink 231 can be improved.

Furthermore, since the Si concentration of the first Al—Ti—Si layer 216A formed at the Ti layer 215 side is higher than the Si concentration of the second Al—Ti—Si layer 216B formed at the metal layer 213 side, the diffusion of Ti atoms toward the metal layer 213 is suppressed by the first Al—Ti—Si layer 216A having a high Si concentration, the thickness of the Al—Ti—Si layer 216 can be made thin.

Also, in the present embodiment, since the circuit layer 212 and the metal layer 213 are respectively formed on the first surface and second surface of the ceramic substrate 11, and furthermore, the metal layer 213 and the heat sink 231 can be bonded at the same time, the production process can facilitate and the production cost can be reduced.

Figure 9:
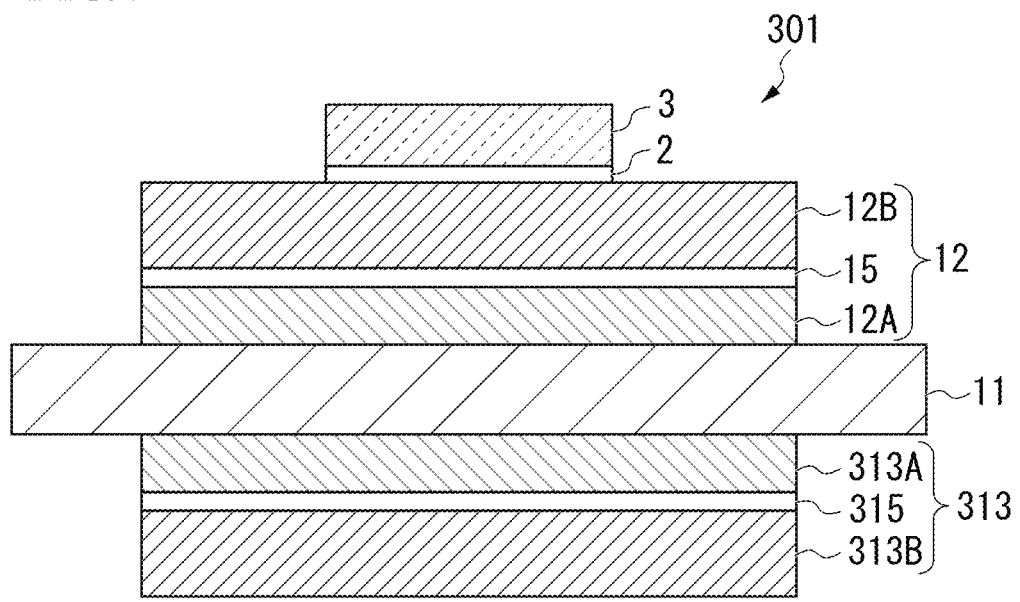
FIG. 9 is a schematic explanatory diagram of a power module according to a third embodiment of the present invention.

As shown in FIG. 9 (third embodiment), the metal layer 313 may include an Al layer 313A formed on a second surface of a ceramic substrate 11, and a Cu layer 313B bonded by solid phase diffusion bonding on a surface of the Al layer 313A that is opposite to a surface of the Al layer 313A to which the ceramic substrate 11 is bonded with a Ti layer 315 interposed between the Al layer 313A and the Cu layer 313B.

In the power module 301 provided with the metal layer 313, when the heat cycle is applied, the heat stress generated in the ceramic substrate 11 is absorbed by the Al layer 313A, and the occurrence of cracks in the ceramic substrate 11 can be prevented. Also, since the Cu layer 313B is formed at the lower side of the Al layer 313A, the heat from the semiconductor device 3 side can be effectively dissipated.

In addition, the first embodiment has been explained the case in which the metal layer is formed of aluminum or an aluminum alloy; however, it is not limited thereto, and the metal layer may be formed of copper or a copper alloy.

Also, the second embodiment has been explained the case in which the metal layer is formed of aluminum or an aluminum alloy and the heat sink is formed of copper or a copper alloy. However, they are not limited thereto, and the metal layer may be formed of copper or a copper alloy and the heat sink may be formed of aluminum or an aluminum alloy.

In the first embodiment, the circuit layer was formed by laminating the aluminum plate which will be the Al layer, by laminating the copper plate which will be the Cu layer on the aluminum plate with the titanium foil interposed therebetween, and by pressurizing and heating them; however, a lead frame (metal member) made of copper can be used instead of the copper plate.

Fifth Embodiment

Figure 13:
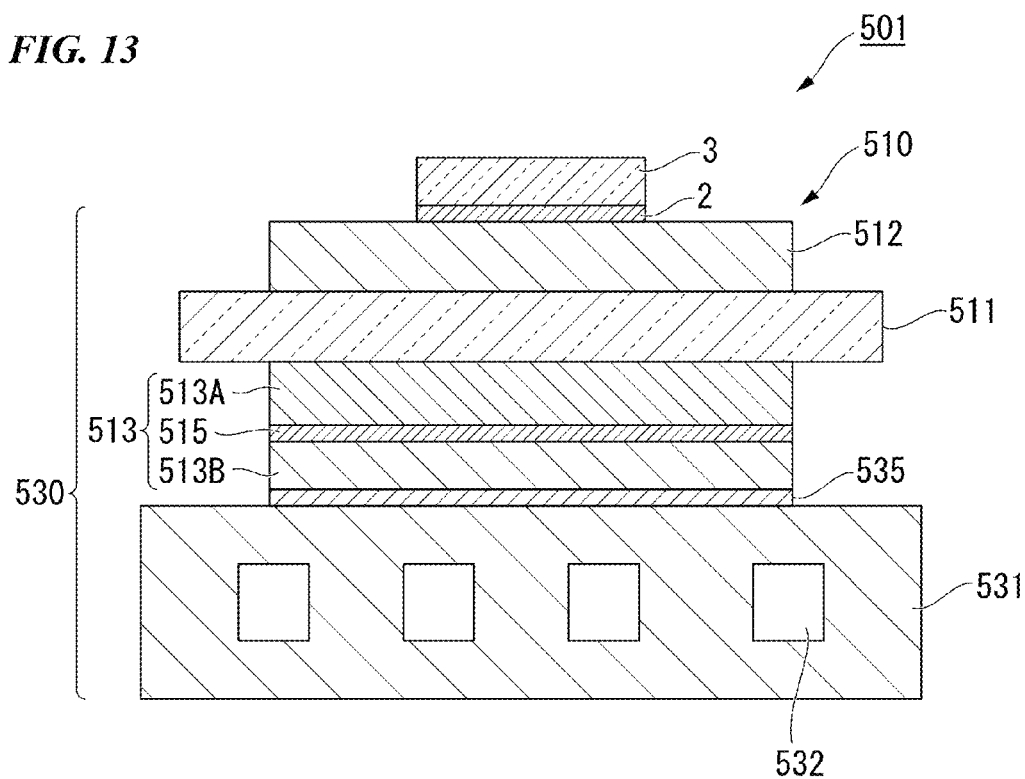
FIG. 13 is a schematic explanatory diagram of a heat-sink-attached-power module according to a fifth embodiment of the present invention.

A heat-sink-attached-power module 501 according to the fifth embodiment of the present invention is shown in FIG. 13.

The heat-sink-attached-power module 501 includes a heat-sink-attached-power module substrate 530, and a semiconductor device 3 bonded to one surface (upper surface in FIG. 13) of the heat-sink-attached-power module substrate 530 with a solder layer 2 interposed therebetween.

The heat-sink-attached-power module substrate 530 includes a power module substrate 510, and a heat sink 531 bonded to a lower side of the power module substrate 510 with a solder layer 535 interposed therebetween.

Figure 14:
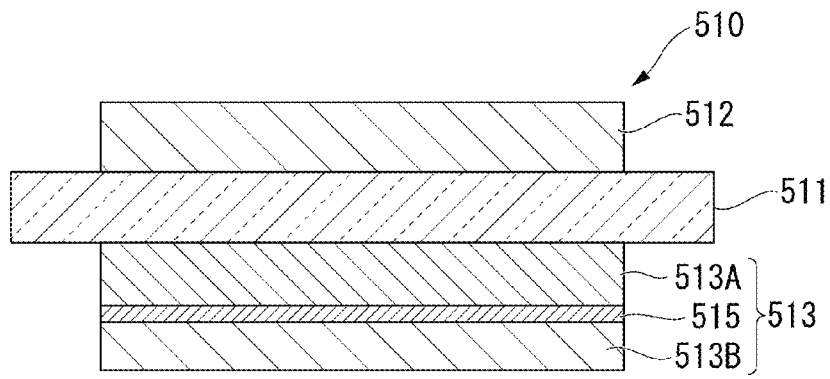
FIG. 14 is a schematic explanatory diagram of a power module substrate according to the fifth embodiment of the present invention.

As shown in FIG. 14, the power module substrate 510 includes; a ceramic substrate 511 constituting an insulation layer, a circuit layer 512 arranged on one surface (upper surface in FIG. 14 and first surface) of the ceramic substrate 511, and a metal layer 513 arranged on the other surface (lower surface in FIG. 14 and second surface) of the ceramic substrate 511.

The ceramic substrate 511 is composed of AlN (aluminum nitride), $Si_3N_4$ (silicon nitride), $Al_2O_3$ (alumina) or the like, each of which has high insulation properties. In the present embodiment, it is composed of AlN (aluminum nitride) which is excellent in heat dissipation properties. The thickness of the ceramic substrate 511 is set in a range of 0.2 to 1.5 mm, and in the present embodiment, the thickness thereof is set to 0.635 mm.

The circuit layer 512 is formed by bonding an aluminum plate composed of aluminum or an aluminum alloy on the first surface (upper surface in FIG. 14) of the ceramic substrate 511. In the present embodiment, the circuit layer 512 is formed by bonding a rolled sheet of aluminum having a purity of 99% or more (so-called 2N aluminum) to the ceramic substrate 511. In addition, the thickness of the aluminum plate that will be the circuit layer 512 is set in a range of 0.1 to 1.0 mm, and in the present embodiment, the thickness thereof is set to 0.6 mm.

As shown in FIG. 13, the metal layer 513 includes an Al layer 513A arranged on the second surface (lower surface in FIG. 14) of the ceramic substrate 511, and a Cu layer 513B (metal member layer) laminated on a surface of the Al layer 513A that is opposite to a surface of the Al layer 513A to which the ceramic substrate 511 is bonded with a Ti layer 515 interposed between the Al layer 513A and the Cu layer 513B.

The Al layer 513A is formed by bonding an aluminum plate composed of aluminum or an aluminum alloy on the second surface of the ceramic substrate 511. In the present embodiment, the Al layer 513A is formed by bonding a rolled sheet of aluminum having a purity of 99% by mass or more (so-called 2N aluminum). The rolled sheet of aluminum having a purity of 99% by mass or more preferably contains Si of 0.08 to 0.95% by mass. In addition, the thickness of the aluminum plate that will be bonded is set in a range of 0.1 to 3.0 mm, and in the present embodiment, the thickness thereof is set to 0.6 mm.

The Cu layer 513B is formed by bonding a copper plate composed of copper or a copper alloy on a surface (lower surface in FIG. 14) of the Al layer 513A that is opposite to a surface of the Al layer 513A on which the ceramic substrate 511 is formed with the Ti layer 515 interposed between the Al layer 513A and the Cu layer 513B. In the present embodiment, the Cu layer 513B is formed by bonding a rolled sheet of oxygen-free copper to the Al layer 513A by solid phase diffusion bonding with titanium foil interposed therebetween.

In addition, the thickness of the copper plate that will be bonded is set in a range of 0.1 to 6.0 mm, and in the present embodiment, the thickness thereof is set to 0.3 mm.

The Ti layer 515 is formed by laminating the Al layer 513A and the copper plate with a titanium foil interposed therebetween and bonding by solid phase diffusion bonding. Here, the titanium foil has a purity of 99% or more. In addition, the thickness of the titanium foil is set to 3 to 40 μm, and in the present embodiment, the thickness thereof is 15 μm.

Figure 15:
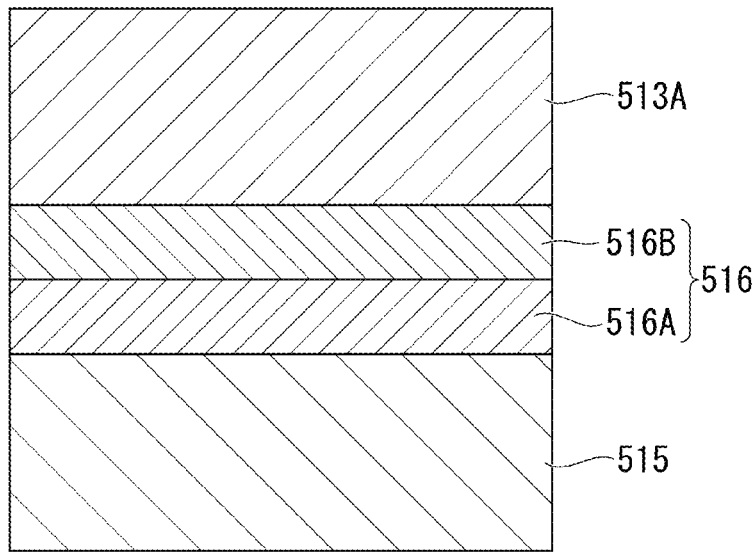
FIG. 15 is an enlarged view of a bonding portion between a Ti layer and an Al layer in a metal layer in FIG. 14.

As shown in FIG. 15, at a bonding interface between the Al layer 513A and the Ti layer 515, an Al—Ti—Si layer 516 in which Si is solid-solubilized into Al$_3$Ti is formed.

The Al—Ti—Si layer 516 is formed by interdiffusion of Al atoms in the Al layer 513A and Ti atoms in the Ti layer 515. The thickness of the Al—Ti—Si layer 516 is set to 0.5 to 10 μm, and in the present embodiment, the thickness thereof is 5 μm.

As shown in FIG. 15, the Al—Ti—Si layer 516 includes a first Al—Ti—Si layer 516A formed at the Ti layer 515 side and a second Al—Ti—Si layer 516B formed at the Al layer 513A side. That is, in the bonding portion between the Al layer 513A and the Cu layer 513B, the Ti layer 515, the first Al—Ti—Si layer 516A, and the second Al—Ti—Si layer 516B are formed.

These first Al—Ti—Si layer 516A and second Al—Ti—Si layer 516B are formed of an Al—Ti—Si phase in which Si is solid-solubilized into Al$_3$Ti, the Si concentration of the second Al—Ti—Si layer 516B is lower than the Si concentration of the first Al—Ti—Si layer 516A. In addition, in the present embodiment, Si contained in the first Al—Ti—Si layer 516A and the second Al—Ti—Si layer 516B is the Si that is contained in the rolled sheet of 2N aluminum as impurities, and diffused into the Al—Ti—Si layer 516 and condensed therein.

The Si concentration of the first Al—Ti—Si layer 516A is 10 to 30 at %, and in the present embodiment, the Si concentration thereof is 20 at %. The Si concentration of the second Al—Ti—Si layer 516B is 1 to 10 at %, and in the present embodiment, the Si concentration thereof is 3 at %.

The semiconductor device 3 is configured of a semiconductor material such as Si. The semiconductor device 3 and the circuit layer 512 are bonded together with a solder layer 2 interposed therebetween.

The solder layer 2 is, for example, a Sn—Ag-based, Sn—Cu-based, Sn—In-based, or Sn—Ag—Cu-based solder material (so-called, lead-free solder material), and it bonds the power module substrate 510 and the semiconductor device 3 together.

A heat sink 531 dissipates the heat of the power module substrate 510 side. The heat sink 531 is composed of copper or a copper alloy, and in the present embodiment, it is composed of oxygen-free copper. In the heat sink 531, a flow path 532 through which a fluid for cooling flows is provided.

The solder layer 535 is, for example, a Sn—Ag-based, Sn—Cu-based, Sn—In-based, or Sn—Ag—Cu-based solder material (so-called, lead-free solder material), as the same as the solder layer 2, and it bonds the power module substrate 510 and the heat sink 531 together.

Figure 16:
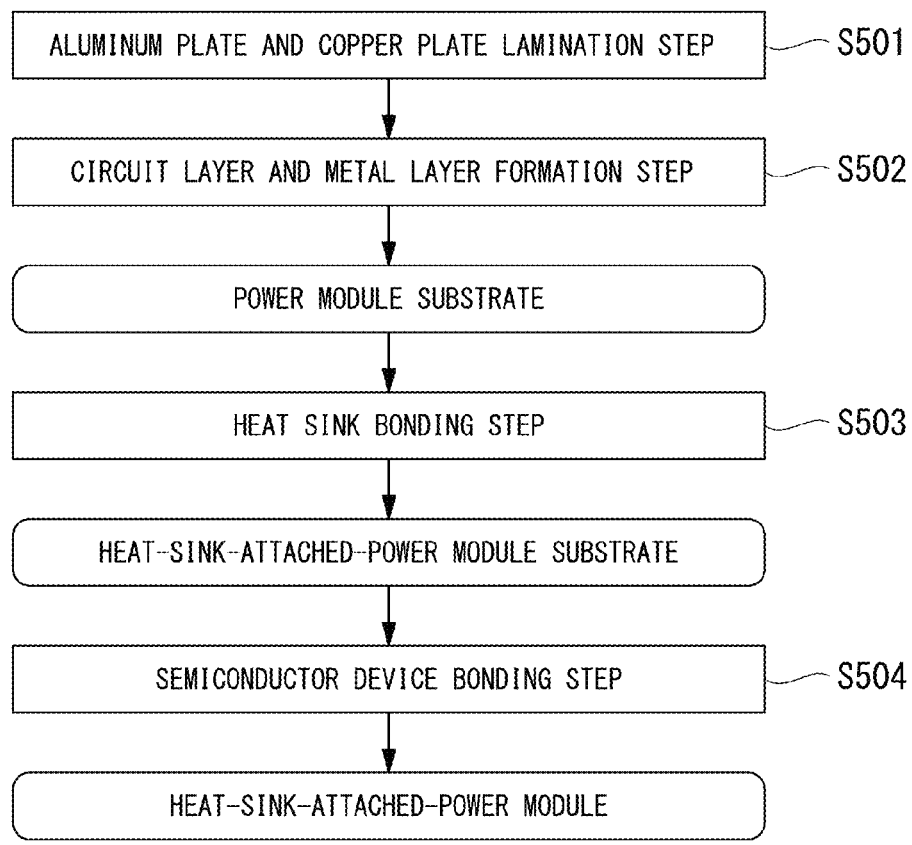
FIG. 16 is a flow chart explaining a production method of a heat-sink-attached-power module according to the fifth embodiment of the present invention.

Next, a production method of the heat-sink-attached-power module 501 according to the present embodiment will be explained with reference to FIGS. 16 and 17.

Figure 17:
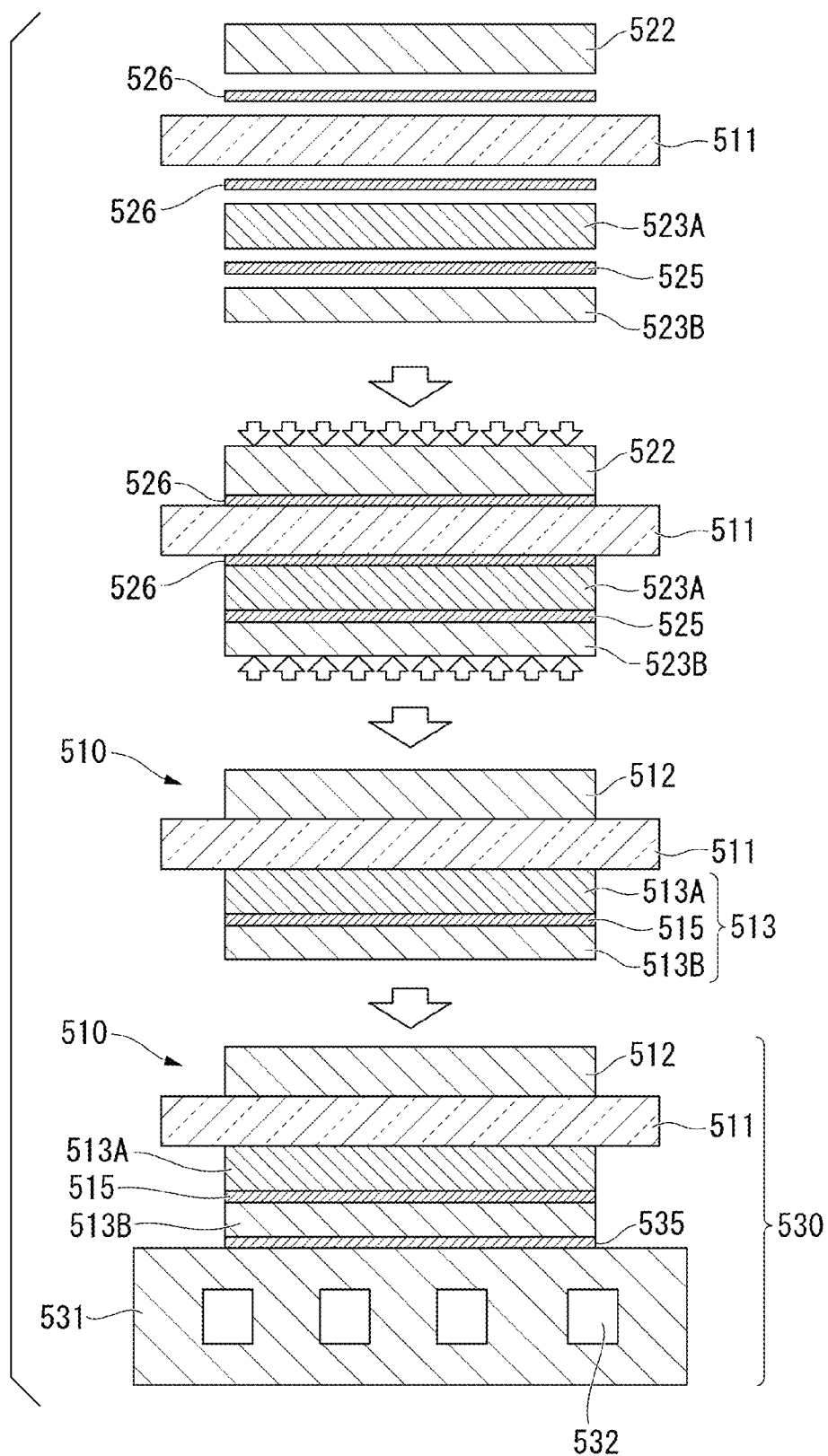
FIG. 17 is a schematic explanatory diagram of a production method of the heat-sink-attached-power module according to the fifth embodiment of the present invention.

First, as shown in FIG. 17, an aluminum plate 522 that will be the circuit layer 512 is laminated on the first surface of the ceramic substrate 511. On the second surface of the ceramic substrate 511, an aluminum plate 523A that will be the Al layer 513A is laminated, and further thereon, a copper plate 523B that will be the Cu layer 513B is laminated with a titanium foil 525 interposed therebetween (aluminum plate and copper plate lamination step S501). Here, in the present embodiment, the aluminum plates 522, 523A, and the ceramic substrate 511 were laminated with an Al—Si-based brazing filler metal 526 interposed between the aluminum plate 522 and ceramic substrate 511 and between the aluminum plate 523A and ceramic substrate 511.

Next, the laminated body is placed in a vacuum heating furnace in a state of being pressurized (at a pressure of 1 to 35 kgf/cm$^2$) in a lamination direction, and the circuit layer 512 and the Al layer 513A are formed. Also, the Al layer 513A and the titanium foil 525 are bonded by solid phase diffusion bonding, the copper plate 523B and the titanium foil 525 are bonded by solid phase diffusion bonding, and the circuit layer 512 and the metal layer 513 are formed (circuit layer and metal layer formation step S502).

Here, the pressure in the vacuum heating furnace is preferably set to a range of 10$^{-6}$ to 10$^{-3}$ Pa, the heating temperature therein is preferably set to 600 to 643° C., and the retention time is preferably set to a range of 30 to 180 minutes. The more preferable heating temperature is in a range of 630 to 643° C. In the present embodiment, it was performed in the conditions of a pressure of 12 kgf/cm$^2$ pressured in the lamination direction, a heating temperature of 640° C., and a retention time of 60 minutes.

In addition, each of the surfaces of the aluminum plate 523A, the titanium foil 525, and the copper plate 523B, which will be bonded, is smoothed in advance by removing scratches thereon, and then, solid phase diffusion bonding is performed.

In the above manner, the power module substrate 510 according to the present embodiment is produced.

Next, the heat sink 531 is laminated on the metal layer 513 of the power module substrate 510 with a solder material interposed therebetween, and solder joint is performed in a reduction furnace (heat sink bonding step S503).

In this manner, the heat-sink-attached-power module substrate 530 according to the present embodiment is produced.

Next, the semiconductor device 3 is laminated on one surface (a surface) of the circuit layer 512 with the solder material interposed therebetween, and solder joint is performed in a reduction furnace (semiconductor device bonding step S504).

In the above manner, the heat-sink-attached-power module 501 according to the present embodiment is produced.

According to the heat-sink-attached-power module 501, the heat-sink-attached-power module substrate 530, and the power module substrate 510 according to the present embodiment configured as above, in the bonding portion of the metal layer 513 between the Al layer 513A and the Cu layer 513B, the Ti layer 515 and the Al—Ti—Si layer 516 are formed, and a hard layer such as an Al—Ti—Cu layer and Al—Ti layer is not formed. Therefore, when the heat cycle is applied, the occurrence of cracks in the metal layer 513 can be prevented. Thus, the bonding reliability between the power module substrate 510 and the heat sink 531 can be improved.

Furthermore, since the Si concentration of the first Al—Ti—Si layer 516A formed at the Ti layer 515 side is higher than the Si concentration of the second Al—Ti—Si layer 516B formed at the Al layer 513A side, the diffusion of Ti atoms toward the Al layer 513A is suppressed by the first Al—Ti—Si layer 516A having a high Si concentration, and the thickness of the Al—Ti—Si layer 516 can be made thin. Accordingly, by the result of making thin the thickness of the Al—Ti—Si layer 516, when the heat cycle is applied, the occurrence of cracks in the bonding portion between the Al layer 513A and the Cu layer 513B can be prevented.

Also, since the Si concentration contained in the second Al—Ti—Si layer 516B formed at the Al layer 513A side is 1 to 10 at %, an excess diffusion of Al atoms toward the Ti layer 515 can be suppressed, and the thickness of the second Al—Ti—Si layer 516B can be made thin.

Moreover, since the Si concentration contained in the first Al—Ti—Si layer 516A formed at the Ti layer 515 side is 10 to 30 at %, an excess diffusion of Ti atoms toward the Al layer 513A can be suppressed, and the thickness of the first Al—Ti—Si layer 516A can be made thin.

Also, in the present embodiment, since the aluminum plate 523A, the titanium foil 525, the copper plate 523B, and the aluminum plate 522 are bonded at one time on the first surface and second surface of the ceramic substrate 511, the production process can facilitate and the production cost can be reduced.

Further, since the Al layer 513A having a relatively small deformation resistance is formed on the second surface of the ceramic substrate 511, the Al layer 513A absorbs the thermal stress generated when the heat cycle is applied, and the occurrence of cracks in the ceramic substrate 511 can be prevented.

Furthermore, since the Cu layer 513B having a relatively large deformation resistance is formed on a surface of the Al layer 513A that is opposite to a surface of the Al layer 513A on which the ceramic substrate 511 is formed, the deformation of the metal layer 513 is suppressed when the heat cycle is applied, the deformation of the solder layer 535 that bonds the metal layer 513 and the heat sink 531 together is suppressed, and the bonding reliability can be improved.

Also, in the present embodiment, the solid phase diffusion bonding between the Al layer 513A (aluminum plate 523A) and the titanium foil 525 and between the copper plate 523B and the titanium foil 525 is performed in the conditions of pressurizing at a pressure of 1 to 35 kgf/cm$^2$ in the lamination direction and retaining at a temperature of 600 to 643° C., Ti atoms are diffused into the Al layer 513A and the copper plate 523B, solid phase diffusion bonding is performed by a solid phase diffusion of Al atoms and Cu atoms diffused into the Ti foil 525, and the Al layer 513A, the titanium foil 525, and the copper plate 523B can be reliably bonded together.

In a case where a pressure applied to the lamination in the lamination direction is less than 1 kgf/cm$^2$ in performing of solid phase diffusion bonding, a sufficient bonding of the Al layer 513A, the titanium foil 525, and the copper plate 523B together becomes difficult, and a gap may cause at the bonding interfaces. In addition, in a case where a pressure applied thereto exceeds 35 kgf/cm$^2$, since the applied pressure is too high, cracks may occur in the ceramic substrate 511. For such reasons, the applied pressure in performing of solid phase diffusion bonding is set to the above range.

In a case where the temperature in performing of solid phase diffusion bonding is 600° C. or more, the diffusion of Al atoms, Ti atoms, and Cu atoms are promoted, and sufficient solid phase diffusion can be performed in a short amount of time. In addition, in a case where the temperature is 643° C. or less, a generation of humps at the bonding interfaces by a generation of a liquid phase caused by melting of aluminum; and a thickness variation, can be suppressed. Thus, the preferable temperature of solid phase diffusion bonding is set to the above range.

In addition, in a case where there are scratches on the surface on which bonding will be performed when solid phase diffusion bonding is performed, a gap may occur when solid phase diffusion bonding is performed. However, in the present embodiment, each of the surfaces of the aluminum plate 523A, the copper plate 523B, and the titanium foil 525, which will be bonded, is smoothed in advance by removing scratches thereon, and then, solid phase diffusion bonding is performed. Therefore, the generation of gaps at each of the bonding interfaces is suppressed and bonding can be performed.

The embodiments of the present invention have been explained as above; however, the present invention is not limited thereto and can be appropriately changed without departing from the technical concept of the present invention.

The above embodiments have been explained in that the Al layer and the Cu layer are bonded together; however, a Ni layer composed of nickel or a nickel alloy, or an Ag layer composed of silver or a silver alloy may be bonded thereto instead of the Cu layer.

For example, in a case where the Ni layer is formed instead of the Cu layer, a good soldering properties is obtained, and the bonding reliability can be improved when the circuit layer and the semiconductor device are bonded together with the solder layer interposed therebetween and/or the metal layer and the heat sink are bonded together with the solder layer interposed therebetween. Furthermore, in a case where the Ni layer is formed by solid phase diffusion bonding, since a masking treatment performed in the formation of a Ni plating film by electroless plating or the like is not necessary, the production cost can be reduced. In this case, it is desirable to set the thickness of the Ni layer to 1 to 30 μm. When the thickness of the Ni layer is less than 1 μm, effects of the improvement of the bonding reliability between the Ni layer and the semiconductor device and/or between the Ni layer and the heat sink may not be obtained, and when the thickness of thereof exceeds 30 μm, the Ni layer becomes a thermal resistance and the transfer of heat toward the power module substrate and/or toward the heat sink may not be effectively performed.

Also, when the Ni layer is formed by solid phase diffusion bonding, the solid phase diffusion bonding can performed using the same condition of the formation of the Cu layer in the first embodiment.

Also, in a case where the Ag layer is formed instead of the Cu layer, since the bonding of the Ag layer and the silver which is derived by reduction of silver oxide is a bonding performed by the same type of metal when the semiconductor and/or the heat sink is bonded by using, for example, a silver oxide paste including silver oxide particles and a reducing agent containing an organic substance, the bonding reliability can be improved. In this case, it is desirable to set the thickness of the Ag layer to 1 to 20 μm. When the thickness of the Ag layer is less than 1 μm, effects of the improvement of the bonding reliability between the Ag layer and the semiconductor device and/or between the Ag layer and the heat sink may not be obtained, and when the thickness of thereof exceeds 20 μm, effects of the improvement of the bonding reliability are not exerted and it incurs an increase in cost.

Also, when the Ag layer is formed by solid phase diffusion bonding, the solid phase diffusion bonding can performed using the same condition of the formation of the Cu layer in the first embodiment.

Figure 18:
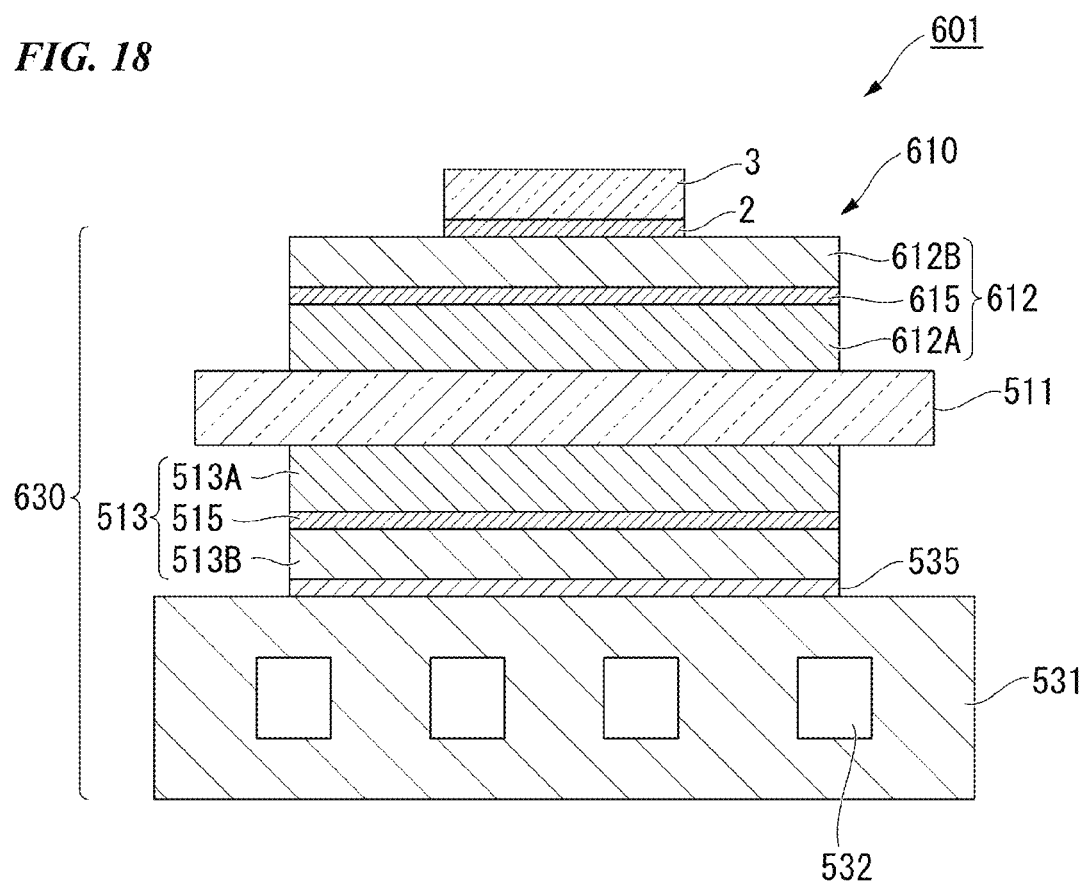
FIG. 18 is a schematic explanatory diagram of a heat-sink-attached-power module according to a sixth embodiment of the present invention.

As shown in FIG. 18 (sixth embodiment), a circuit layer 612 may include an Al layer 612A formed on a first surface (upper surface in FIG. 18) of a ceramic substrate 511, and a Cu layer 612B bonded by solid phase diffusion bonding on one surface (upper surface in FIG. 18) of the Al layer 612A with a Ti layer 615 interposed therebetween.

In the power module 601 provided with the circuit layer 612, when the heat cycle is applied, the heat stress generated in the ceramic substrate 511 is absorbed by the Al layer 612A, and the occurrence of cracks in the ceramic substrate

511 can be prevented. Also, since the Cu layer 612B is formed at the upper side of the Al layer 612A, the heat from the semiconductor device 3 side is spread and can be effectively dissipated toward a heat sink 531 side.

Figure 10:
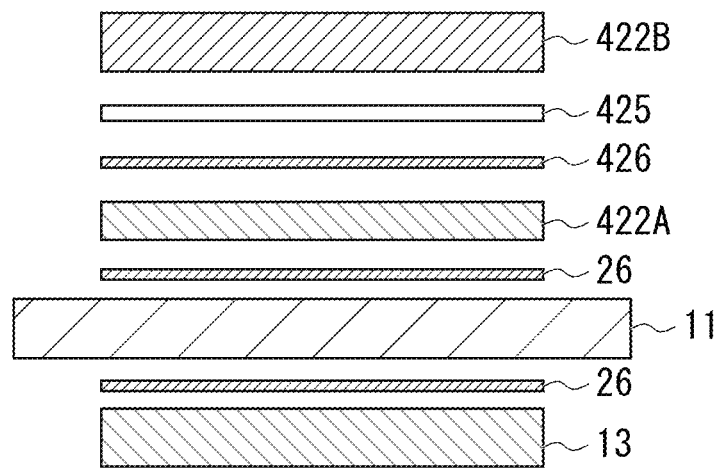
FIG. 10 is a schematic explanatory diagram of a production method of the power module according to a fourth embodiment of the present invention.
Figure 19:
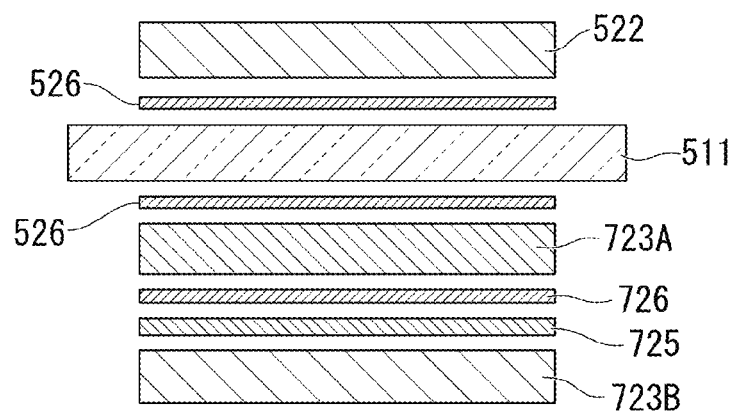
FIG. 19 is a schematic explanatory diagram of a production method of the power module substrate according to a seventh embodiment of the present invention.

In addition, the above present embodiments have been explained the cases in which the aluminum plate composed of 2N aluminum and the copper plate composed of oxygen-free copper are laminated and bonded by solid phase diffusion bonding with the titanium foil interposed therebetween. However, in a case where an aluminum plate composed of 4N aluminum having a less content of Si than that in 2N aluminum and a copper plate are bonded together by solid phase diffusion bonding with the titanium foil interposed therebetween, an Al—Ti—Si layer in which Si is solid-solubilized in the $Al_3Ti$ is not formed at the bonding interface thereof, and an $Al_3Ti$ layer (Al—Ti layer) grows thick. When the aluminum plate composed of 4N aluminum and the copper plate are bonded together, as shown in, for example, FIG. 10 (fourth embodiment) and FIG. 19 (seventh embodiment), the first Al—Ti—Si layer and the second Al—Ti—Si layer can be formed as the same with the power module substrate 10 (510) by sequentially laminating the aluminum plate 422A (723A) composed of 4N aluminum, an Al—Si-based brazing filler metal foil 426 (726), a titanium foil 425 (725), and the copper plate 422B (723B) and by bonding them by solid phase diffusion bonding; and thus the occurrence of cracks in the circuit layer or the metal layer can be prevented when the heat cycle is applied.

Also, the above embodiments have been explained the cases in which the metal layer and the heat sink are bonded together with the solder material interposed therebetween; however, the bonding may be performed by other techniques. For example, the bonding may be performed by the above-described silver oxide paste or a brazing filler metal foil.

In addition, the above embodiments have been explained the cases in which the circuit layer is formed of aluminum or an aluminum alloy; however, it is not limited thereto, and the circuit layer may be formed of copper or a copper alloy. Also, the circuit layer may be part of a lead frame formed of copper or a copper alloy.

Also, the embodiments have been explained the cases in which the heat sink is formed of copper or a copper alloy. However, it is not limited thereto, and the heat sink may be formed of aluminum or an aluminum alloy.

Also, the above embodiments have been explained the cases in which an aluminum plate and another aluminum plate are respectively bonded to the first surface and the second surface of the ceramic substrate with the Al—Si-based brazing filler metal foil interposed therebetween; however, it is not limited thereto, and the method of Transient Liquid Phase Bonding may be applied.

In the above embodiments, the bonding body (or metal layer) was formed by laminating the aluminum plate which will be the Al layer on the first surface or the second surface of the ceramic substrate with the Al—Si-based brazing filler metal foil interposed therebetween, by further laminating the copper plate which will be the Cu layer on the aluminum plate with the titanium foil interposed therebetween, and by pressurizing and heating them; however, a clad metal made of Ti/Cu may be used instead of the titanium foil and the copper plate. Also, a clad metal made of three layers of Al/Ti/Cu may be used instead of the titanium foil and the copper plate.

In a case where the Ni layer is formed instead of the Cu layer, a clad metal made of Ti/Ni or a clad metal made of Al/Ti/Ni can be used.

In a case where the Ag layer is formed instead of the Cu layer, a clad metal made of Ti/Ag or a clad metal made of Al/Ti/Ag can be used.

EXAMPLES

Example 1

Hereinafter, the result of the confirmation experiment which was performed to confirm the effects of the present invention is explained.

As a bonding body of each of Present Invention's Examples 1-1 to 1-7, as shown in Table 1, a plate (2 mm×2 mm, and thickness of 0.3 mm) made of a metal member described in Table 1 was laminated on one surface of an aluminum plate (10 mm×10 mm, and thickness of 0.6 mm) formed of 2N aluminum containing Si of 0.25% by mass with a titanium foil interposed therebetween, and the plate and the aluminum plate were bonded together by solid phase diffusion bonding in a condition shown in Table 1 by the methods described in the above embodiments.

As a bonding body of Comparative Example 1-1, a metal member (2 mm×2 mm, and thickness of 0.3 mm) formed of an oxygen-free copper plate was laminated on one surface of an aluminum member (10 mm×10 mm, and thickness of 0.6 mm) formed of an aluminum plate having a purity of 99.99% or more with a titanium foil interposed therebetween, and the metal member and the aluminum member were bonded together by solid phase diffusion bonding in a condition shown in Table 1 as the same with the bonding body of Present Invention's Examples 1-1.

Observation of cross-sectional surface of the bonding bodies and shear test were carried out on the bonding bodies obtained as above.

<Observation of Cross-Sectional Surface of Bonding Bodies>

A cross-sectional surface of each of the bonding bodies was carried out ion etching with conditions of an ion accelerating voltage: 5 kV; a processing time: 14 hours; and a projection amount from a masking shield: 100 μm, by using a cross-section polisher (SM-09010 produced by JEOL Ltd.), and then a bonding portion between an Al layer (aluminum member) and a metal member layer (metal member) was observed. Also, chemical composition analysis of the bonding portion was carried out using an analyzer of EPMA (electron probe microanalysis), and the presence of the formation of an Al—Ti—Si layer in which Si is solid-solubilized into $Al_3Ti$ at a bonding interface between a Ti layer and an Al layer (interface between the Ti layer and the aluminum member in FIGS. 11 and 12) was checked.

<Shear Test>

A shear test was carried out on the bonding bodies and shear strength was measured. In addition, the shear test was carried out so as to comply with the standard of the International Electrotechnical Commission IEC 60749-19.

Figure 11:
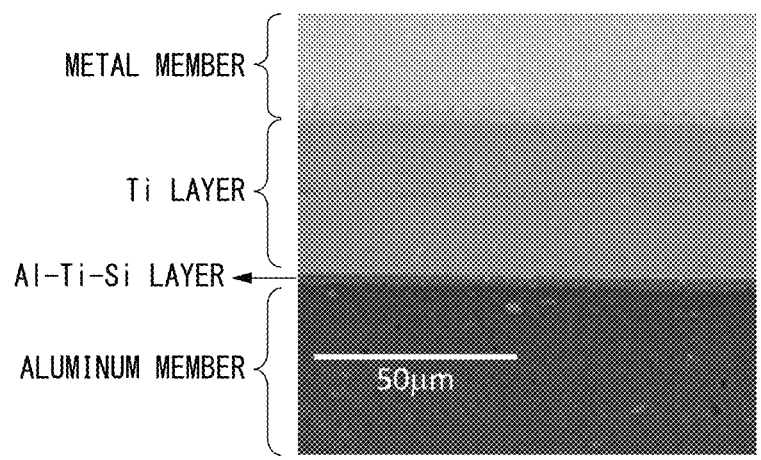
FIG. 11 is a SEM picture of the bonding portion between an aluminum member and a copper member in a bonding body of the Present Invention's Example 1-1.
Figure 12:
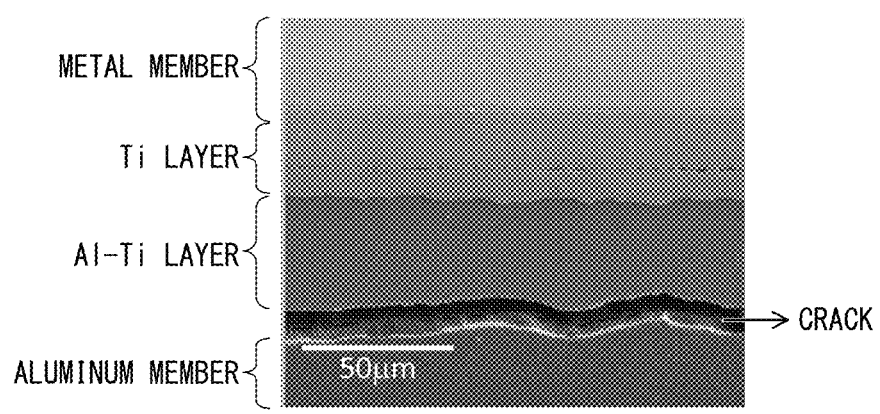
FIG. 12 is a SEM picture of the bonding portion between an aluminum member and a copper member in a bonding body of the Comparative Example 1-1.

As one example of the observation result of cross-sectional surface, the observation result (SEM image) of cross-sectional surface of the Present Invention's Example 1-1 was shown in FIG. 11, and the observation result (SEM image) of cross-sectional surface of the Comparative Example 1-1 was shown in FIG. 12. Also, in Table 1, the presence of the layer, and the measurement results of shear test of the bonding body were shown.

The bonding body in which the Al—Ti—Si layer can be confirmed from the above method was recorded as "Present" in Table; whereas, the bonding body in which the Al—Ti—Si layer cannot be confirmed was recorded as "None".

TABLE 1

| | Aluminum member | Metal member | Conditions of Solid-Solubilized Bonding | | | Shear Strength MPa |
| --- | --- | --- | --- | --- | --- | --- |
| | | | Temperature [° C.] | Time [minute] | Presence of Al—Ti—Si layer | |
| Present Invention's Example 1-1 | 2N aluminum | Oxygen-free copper | 600 | 60 | Present | 83 |
| Present Invention's Example 1-2 | 2N aluminum | Oxygen-free copper | 610 | 60 | Present | 84 |
| Present Invention's Example 1-3 | 2N aluminum | Oxygen-free copper | 630 | 120 | Present | 86 |
| Present Invention's Example 1-4 | 2N aluminum | Oxygen-free copper | 640 | 30 | Present | 85 |
| Present Invention's Example 1-5 | 2N aluminum | Oxygen-free copper | 640 | 180 | Present | 84 |
| Present Invention's Example 1-6 | 2N aluminum | Nickel | 640 | 90 | Present | 81 |
| Present Invention's Example 1-7 | 2N aluminum | Silver | 640 | 90 | Present | 79 |
| Comparative Example 1-1 | 4N aluminum | Oxygen-free copper | 640 | 30 | None | 28 |

In the Present Invention's Example 1-1, as shown in FIG. 11, the Al—Ti—Si layer was confirmed between the Ti layer and the Al layer (aluminum member). It was confirmed that the thickness of the Al—Ti—Si layer is formed thin. It was confirmed that such Al—Ti—Si layer is also formed in the Present Invention's Examples 1-2 to 1-7.

On the other hand, in Comparative Example 1-1, an Al—Ti layer was formed between the Ti layer and the Al layer, but an Al—Ti—Si layer was not confirmed. As shown in FIG. 12, the thickness of the Al—Ti layer of the Comparative Example 1-1 is thicker than the thickness of the Al—Ti—Si layer of the Present Invention's Examples 1-1 to 1-7, and cracks were observed at the bonding interface thereof.

Also, in the Comparative Example 1-1 in which the Al—Ti—Si layer was not confirmed, the shear strength was 28 MPa, whereas in the Present Invention's Examples 1-1 to 1-7 in which the Al—Ti—Si layer was confirmed, the shear strength was 79 MPa or more and a significantly high shear strength was confirmed in the Present Invention's Examples.

Example 2

A power module of each of Present Invention's Examples 2-1 to 2-7 was produced in a following manner. A 2N aluminum plate (having a thickness of 0.6 mm) which contains Si of 0.25% by mass and will be an Al layer was laminated on a first surface of a ceramic substrate, and a plate made of a metal member described in Table 2 was laminated further thereon with a titanium foil interposed therebetween. Also, a 4N aluminum plate (having a thickness of 0.6 mm) which has a purity of 99.99% or more and will be a metal layer was laminated on a second surface of the ceramic substrate. Here, an Al—Si-based brazing filler metal foil was laminated between the aluminum plate and the ceramic substrate. Next, heating treatment was carried out in a condition shown in Table 2, the Al layer and the metal layer were respectively formed on the first surface and the second surface of the ceramic substrate, and the circuit layer was formed by bonding a plate formed of the Al layer, a titanium foil, and the metal member by solid phase diffusion bonding. A semiconductor device was bonded to one surface of the circuit layer with a solder material interposed therebetween.

A power module of the Comparative Example 2-1 was produced in the same manner with the power module of the Present Invention's Example 2-1 except for using a 4N aluminum having a purity of 99.99% or more as the Al layer.

In addition, heating treatment was carried out in the condition shown in Table 2.

In the bonding portion between the Al layer and the metal member layer of the circuit layer of the power module produced in the above manner, as the same with the Example 1, the presence of an Al—Ti—Si layer was checked. The sample in which the Al—Ti—Si layer is confirmed by the same method in the Example 1 was recorded as "Present" in the Table; whereas, the sample in which the Al—Ti—Si layer cannot be confirmed was recorded as "None" in the Table. Furthermore, heat cycle test was carried out on the power modules, and a bonding rate of the bonding portion between the Al layer and the metal member layer after the test was measured. Also, an initial bonding rate (bonding rate before heat cycle test) of the bonding portion between the Al layer and the metal member layer was measured. The heat cycle test and the measurement of the bonding rate were carried out as below.

<Heat Cycle Test>

Heat cycle test was carried out by applying heat cycles that repeat from −40 to 125° C. to the power module. In the present example, 4000 cycles of the heat cycle were applied.

The bonding rate of the interface between the Al layer and the metal member layer was measured before and after the heat cycle test.

<Evaluation of Bonding Rate of Bonding Portion between Al Layer and Metal Member Layer>

With respect to the power module before and after the heat cycle test, the bonding rate of the bonding portion between the Al layer and the metal member layer was evaluated using an ultrasonic flaw detection device, and the bonding rate was calculated from the calculating formula shown below. Here, the initial bonding area was defined as a target area of bonding at the time before the bonding, that is, the area of the Al layer. Since the peeled off part is indicated by a white color part in an ultrasonic flaw detection image, the area of the white color part is defined as a peeled off area.

(Bonding rate (%))={(Initial bonding area)−(Peeled off area)}/(Initial bonding area)×100

The evaluation results of the above are shown in Table 2.

TABLE 2

| | Aluminum member | Metal member | Conditions of Solid-Solubilized Bonding Temperature [° C.] | Time [minute] | Presence of Al—Ti—Si layer | Initial Bonding Rate % | Bonding Rate after Heat cycle test % |
|---|---|---|---|---|---|---|---|
| Present Invention's Example 2-1 | 2N aluminum | Oxygen-free copper | 600 | 30 | Present | 98.2 | 93.8 |
| Present Invention's Example 2-2 | 2N aluminum | Oxygen-free copper | 620 | 30 | Present | 100 | 96.3 |
| Present Invention's Example 2-3 | 2N aluminum | Oxygen-free copper | 630 | 60 | Present | 99.1 | 98.4 |
| Present Invention's Example 2-4 | 2N aluminum | Oxygen-free copper | 640 | 30 | Present | 100 | 99.5 |
| Present Invention's Example 2-5 | 2N aluminum | Oxygen-free copper | 640 | 180 | Present | 100 | 99.8 |
| Present Invention's Example 2-6 | 2N aluminum | Nickel | 640 | 120 | Present | 97.8 | 97.3 |
| Present Invention's Example 2-7 | 2N aluminum | Silver | 640 | 120 | Present | 98.5 | 96.4 |
| Comparative Example 2-1 | 4N aluminum | Oxygen-free copper | 640 | 30 | None | 72.5 | 8.4 |

In the Comparative Example 2-1 in which an Al—Ti—Si layer was not confirmed, the initial bonding rate was as low as 72.5%, and the bonding rate significantly decreased after the heat cycle test.

On the other hand, in the Present Invention's Examples 2-1 to 2-7 in which an Al—Ti—Si layer was confirmed, the initial bonding rate was as high as 97.8% or more, and the bonding rate after the heat cycle test was maintained in high rate. Thus, it was confirmed that the power module according to the Present Invention's Examples are high in bonding reliability.

Example 3

Hereinafter, the result of the confirmation experiment which was performed to confirm the effects of the present invention is explained.

A heat-sink-attached-power module of each of Present Invention's Examples 3-1 to 3-5 was produced in a following manner. An Al (2N—Al) plate which has a purity of 99% or more and will be a circuit layer was laminated on a first surface of a ceramic substrate shown in Table 3. Also, in a second surface of the ceramic substrate, an aluminum plate which has a purity of 99% or more (and containing Si of 0.25% by mass) and will be an Al layer was laminated, and a copper plate formed of oxygen-free copper was laminated further on the aluminum plate with a titanium foil interposed therebetween. Here, an Al—Si-based brazing filler metal foil was laminated between the aluminum plate and the ceramic substrate. Next, heating treatment was carried out in a condition shown in Table 3, the circuit layer and the Al layer were respectively formed on the first surface and the second surface of the ceramic substrate, and the metal layer was formed by bonding the Al layer, a titanium foil, and the copper plate by solid phase diffusion bonding. The metal layer of the power module substrate and a heat sink shown in Table 3 are bonded together using a Sn—Sb-based solder material. Also, a semiconductor device was bonded to one surface of the circuit layer with a Sn—Sb-based solder material interposed therebetween.

A production method of a heat-sink-attached-power module of each of Present Invention's Examples 3-6 to 3-8 will be explained. A 2N aluminum plate which contains Si of 0.25% by mass and will be an Al layer was laminated on a first surface of a ceramic substrate, and a metal plate which will be a metal member layer described in Table 3 was laminated further on the 2N aluminum plate with a titanium foil interposed therebetween. Also, an aluminum plate which has a purity of 99% or more, (contains Si of 0.25% by mass,) and will be another Al layer was laminated on a second surface of the ceramic substrate, another metal plate which will be another metal member layer described in Table 3 was laminated further on the aluminum plate with a titanium foil interposed therebetween. Here, an Al—Si-based brazing filler metal foil was laminated between the aluminum plate and the ceramic substrate. Next, heating treatment was carried out in a condition shown in Table 3, the Al layers each were formed on the first surface and the second surface of the ceramic substrate, and each of the circuit layer and the metal layer was formed by bonding a plate formed of the Al layer, titanium foil, and the metal member by solid phase diffusion bonding.

The metal layer of the power module substrate and a heat sink shown in Table 3 were bonded together using a Sn—Sb-based solder material. A semiconductor device was bonded to one surface of the circuit layer with a Sn—Sb-based solder material interposed therebetween.

A heat-sink-attached-power module of the Comparative Example 3-1 was produced in the same manner with the heat-sink-attached-power module of the Present Invention's Example 3-1 except for using aluminum having a purity of 99.99% or more (4N aluminum) as the Al layer. In addition, heat treatment was carried out in the condition shown in Table 3.

In the bonding portion between the Al layer and the metal member layer of the metal layer of the heat-sink-attached-power module produced in the above manner, the observation of cross-sectional surface was carried out, and the presence of an Al—Ti—Si layer was checked.

Thermal cycle test (heat cycle test) was carried out on the heat-sink-attached-power module, and the bonding rate between the ceramic substrate and the metal layer after the test was evaluated.

Each evaluation of the observation of cross-sectional surface, thermal cycle test (heat cycle test), and bonding rate was carried out as described in the Example 1 and Example 2. However, the number of heat cycles was 3000 cycles, the evaluation of the bonding rate was carried out to the heat-sink-attached-power module after the thermal cycle test (heat cycle test), and the bonding rate of the bonding portion between the Al layer and the metal member layer was evaluated.

The evaluation results of the above are shown in Table 3.

TABLE 3

| | Circuit Layer | | | Metal Layer | | | Conditions of solid-solubilized bonding | | Presence of Al—Ti—Si layer | Bonding Rate between Al layer and Cu layer after Thermal cycle test % |
|---|---|---|---|---|---|---|---|---|---|---|
| | Al layer | Metal member Layer | Ceramic Substrate | Al layer | Metal member Layer | Heat sink | Temperature [°C.] | Time [minute] | | |
| Present Invention's Example 3-1 | 2N aluminum | — | AlN | 2N aluminum | Oxygen-free copper | Deoxidized copper | 600 | 180 | Present | 93.6 |
| Present Invention's Example 3-2 | 2N aluminum | — | AlN | 2N aluminum | Oxygen-free copper | Deoxidized copper | 630 | 60 | Present | 95.2 |
| Present Invention's Example 3-3 | 2N aluminum | — | Alumina | 2N aluminum | Oxygen-free copper | Deoxidized copper | 630 | 60 | Present | 96.7 |
| Present Invention's Example 3-4 | 2N aluminum | — | $Si_3N_4$ | 2N aluminum | Oxygen-free copper | Deoxidized copper | 640 | 30 | Present | 94.4 |
| Present Invention's Example 3-5 | 2N aluminum | — | AlN | 2N aluminum | Oxygen-free copper | A6063 (with Ni plating) | 640 | 30 | Present | 96.2 |
| Present Invention's Example 3-6 | 2N aluminum | Oxygen-free copper | AlN | 2N aluminum | Oxygen-free copper | Deoxidized copper | 640 | 30 | Present | 98.3 |
| Present Invention's Example 3-7 | 2N aluminum | Nickel | AlN | 2N aluminum | Nickel | Deoxidized copper | 640 | 120 | Present | 95.8 |
| Present Invention's Example 3-8 | 2N aluminum | Silver | AlN | 2N aluminum | Silver | Deoxidized copper | 640 | 120 | Present | 93.8 |
| Comparative Example 3-1 | 2N aluminum | — | AlN | 4N aluminum | Oxygen-free copper | Deoxidized copper | 630 | 60 | None | 7.2 |

In the Present Invention's Example 3-1 to 3-8 in which an Al—Ti—Si layer was confirmed, the bonding rate after the thermal test was as high as 94.4%, and thus, it was confirmed that the power module according to the Present Invention's Examples are high in bonding reliability.

On the other hand, in the Comparative Example 3-1 in which an Al—Ti—Si layer was not confirmed, the bonding rate after the heat cycle test significantly decreased as compared with the Present Invention's Examples.

FIELD OF INDUSTRIAL APPLICATION

The present invention provides a bonding body, a power module substrate, and a heat-sink-attached-power module substrate, in each of which, an aluminum member (Al layer) and a metal member (metal member layer) composed of any one of copper, nickel, and silver are satisfactorily bonded together, each of which can prevent the occurrence of cracks in the bonding portion between the aluminum member and metal member, and each of which has a good bonding reliability.

DESCRIPTION OF REFERENCE SIGNS

10, 210, 510, 610: Power module substrate
11, 511: Ceramic substrate (Insulation layer)
12, 612: Circuit layer (Bonding body)
12A, 313A, 513A, 612A: Al layer
12B, 313B, 513B, 612B: Cu layer (Metal member layer)
13: Metal layer
15, 215, 315, 515, 615, 715: Ti layer
16, 216, 516: Al—Ti—Si layer
16A, 216A, 516A: First Al—Ti—Si layer
16B, 216B, 516B: Second Al—Ti—Si layer
212, 512: Circuit layer
213: Metal layer (Al layer)
230, 530, 630: Heat-sink-attached-power module substrate
231, 531: Heat sink (Metal member)
313, 513: Metal layer (Bonding body)

What is claimed is:

1. A bonding body comprising:
   an aluminum member composed of aluminum; and
   a metal member composed of any of copper and silver,
   wherein the aluminum member and the metal member are bonded together,
   wherein in a bonding portion between the aluminum member and the metal member, a Ti layer and an Al—Ti—Si layer are formed,
   the Ti layer being disposed at the metal member side; and
   the Al—Ti—Si layer being disposed between the Ti layer and the aluminum member and containing Si which is solid-solubilized into $Al_3Ti$, and
   wherein the Al—Ti—Si layer includes:
   a first Al—Ti—Si layer formed at the Ti layer side; and
   a second Al—Ti—Si layer formed at the aluminum member side and a Si concentration of which is lower than a Si concentration of the first Al—Ti—Si layer.

2. The bonding body according to claim 1, wherein a Si concentration contained in the second Al—Ti—Si layer is 1 at % or more in the bonding body.

3. A power module substrate comprising:
   an insulation layer; and
   a circuit layer formed on one surface of the insulation layer,
   wherein the circuit layer is formed of the bonding body according to claim 1,
   wherein the circuit layer includes:
   an Al layer formed of the aluminum member and formed on one surface of the insulation layer, and
   a metal member layer formed of the metal member and formed on one surface of the Al layer,
   wherein in a bonding portion between the Al layer and the metal member layer, a Ti layer and an Al—Ti—Si layer are formed,
   the Ti layer being disposed at the metal member layer side, and
   the Al—Ti—Si layer being disposed between the Ti layer and the Al layer and containing Si which is solid-solubilized into $Al_3Ti$, and wherein the Al—Ti—Si layer includes:
a first Al—Ti—Si layer formed at the Ti layer side; and
a second Al—Ti—Si layer formed at the Al layer side and a Si concentration of which is lower than a Si concentration of the first Al—Ti—Si layer.

4. The power module substrate according to claim 3, further comprising:
a metal layer formed on the other surface of the insulation layer,
wherein the metal layer is formed of the bonding body comprising:
an aluminum member composed of aluminum; and
a metal member composed of any of copper and silver,
wherein the aluminum member and the metal member are bonded together,
wherein in a bonding portion between the aluminum member and the metal member, a Ti layer and an Al—Ti—Si layer are formed,
the Ti layer being disposed at the metal member side; and
the Al—Ti—Si layer being disposed between the Ti layer and the aluminum member and containing Si which is solid-solubilized into Al$_3$Ti, and
wherein the Al—Ti—Si layer includes:
a first Al—Ti—Si layer formed at the Ti layer side; and
a second Al—Ti—Si layer formed at the aluminum member side and a Si concentration of which is lower than a Si concentration of the first Al—Ti—Si layer;
wherein the metal layer includes:
an Al layer formed of the aluminum member and formed on the other surface of the insulation layer, and
a metal member layer formed on a surface of the Al layer that is opposite to a surface of the Al layer on which the insulation layer is formed, and formed of the metal member,
wherein in a bonding portion between the Al layer and the metal member layer, a Ti layer and an Al—Ti—Si layer are formed,
the Ti layer being disposed at the metal member layer side, and
the Al—Ti—Si layer being disposed between the Ti layer and the Al layer and containing Si which is solid-solubilized into Al$_3$Ti, and
wherein the Al—Ti—Si layer includes:
a first Al—Ti—Si layer formed at the Ti layer side; and
a second Al—Ti—Si layer formed at the Al layer side and a Si concentration of which is lower than a Si concentration of the first Al—Ti—Si layer.

5. A power module substrate comprising:
an insulation layer;
a circuit layer formed on one surface of the insulation layer; and
a metal layer formed on the other surface of the insulation layer,
wherein the metal layer is formed of the bonding body according to claim 1, and
wherein in a bonding portion between an Al layer formed of the aluminum member and a metal member layer formed of the metal member, a Ti layer and an Al—Ti—Si layer are formed,
the Ti layer being disposed at the metal member layer side, and
the Al—Ti—Si layer being disposed between the Ti layer and the Al layer and containing Si which is solid-solubilized into Al$_3$Ti, and
wherein the Al—Ti—Si layer includes:
a first Al—Ti—Si layer formed at the Ti side; and
a second Al—Ti—Si layer formed at the Al layer side and a Si concentration of which is lower than a Si concentration of the first Al—Ti—Si layer.

6. A heat-sink-attached power module substrate comprising:
the power module substrate according to claim 3, and
a heat sink bonded to the metal layer.

7. The heat-sink-attached power module substrate according to claim 6, wherein
the metal layer and the heat sink are bonded together through a solder layer.

8. A heat-sink-attached power module substrate comprising:
an insulation layer; and
a circuit layer formed on one surface of the insulation layer,
a metal layer formed on the other surface of the insulation layer, and
a heat sink bonded on the metal layer,
wherein the metal layer and the heat sink are formed of the bonding body according to claim 1,
wherein one of the metal layer and the heat sink of the bonding body is formed of aluminum, and the other of the metal layer and the heat sink of the bonding body is formed of any one of copper, nickel and silver, and
wherein in a bonding portion between the metal layer and the heat sink, a Ti layer and an Al—Ti—Si layer are formed,
the Ti layer being disposed at the metal layer side when the metal layer of the bonding body is formed of any one of copper, nickel and silver or being disposed at the heat sink side when the heat sink of the bonding body is formed of any one of copper, nickel and silver, and
the Al—Ti—Si layer being disposed between the Ti layer and the metal layer when the metal layer of the bonding body is composed of aluminum or being disposed between the Ti layer and the heat sink when the heat sink of the bonding body is composed of aluminum, and containing Si which is solid-solubilized into Al$_3$Ti, and
wherein the Al—Ti—Si layer includes:
a first Al—Ti—Si layer formed at the Ti side; and
a second Al—Ti—Si layer formed at the metal layer side when the metal layer of the bonding body is composed of aluminum or formed at the heat sink side when the heat sink of the bonding body is composed of aluminum, and a Si concentration of which is lower than a Si concentration of the first Al—Ti—Si layer.

9. A heat-sink-attached power module substrate comprising:
the power module substrate according to claim 5, and
a heat sink bonded to the metal layer.

10. The heat-sink-attached power module substrate according to claim 9, wherein
the metal layer and the heat sink are bonded together through a solder layer.

11. A bonding body comprising:
an aluminum member composed of aluminum and Si of 0.08 to 0.95% by mass; and
a metal member composed of nickel,
wherein the aluminum member and the metal member are bonded together,
wherein in a bonding portion between the aluminum member and the metal member, a Ti layer and an Al—Ti—Si layer are formed, the Ti layer being disposed at the metal member side; and
the Al—Ti—Si layer being disposed between the Ti layer and the aluminum member and containing Si which is solid-solubilized into $Al_3Ti$ by solid phase diffusion bonding, and
wherein the Al—Ti—Si layer includes:
a first Al—Ti—Si layer formed at the Ti layer side; and
a second Al—Ti—Si layer formed at the aluminum member side and a Si concentration of which is lower than a Si concentration of the first Al—Ti—Si layer.

12. The bonding body according to claim 11, wherein a Si concentration contained in the second Al—Ti—Si layer is 1 at % or more in the bonding body.

13. A power module substrate comprising:
an insulation layer; and
a circuit layer formed on one surface of the insulation layer,
wherein the circuit layer is formed of the bonding body according to claim 11,
wherein the circuit layer includes:
an Al layer formed of the aluminum member and formed on one surface of the insulation layer, and
a metal member layer formed of the metal member and formed on one surface of the Al layer,
wherein in a bonding portion between the Al layer and the metal member layer, a Ti layer and an Al—Ti—Si layer are formed,
the Ti layer being disposed at the metal member layer side, and
the Al—Ti—Si layer being disposed between the Ti layer and the Al layer and containing Si which is solid-solubilized into $Al_3Ti$, and
wherein the Al—Ti—Si layer includes:
a first Al—Ti—Si layer formed at the Ti layer side; and
a second Al—Ti—Si layer formed at the Al layer side and a Si concentration of which is lower than a Si concentration of the first Al—Ti—Si layer.

14. The power module substrate according to claim 13, further comprising:
a metal layer formed on the other surface of the insulation layer,
wherein the metal layer is formed of the bonding body comprising:
an aluminum member composed of aluminum and Si of 0.08 to 0.95% by mass; and
a metal member composed of nickel,
wherein the aluminum member and the metal member are bonded together,
wherein in a bonding portion between the aluminum member and the metal member, a Ti layer and an Al—Ti—Si layer are formed,
the Ti layer being disposed at the metal member side; and
the Al—Ti—Si layer being disposed between the Ti layer and the aluminum member and containing Si which is solid-solubilized into $Al_3Ti$ by solid phase diffusion bonding, and
wherein the Al—Ti—Si layer includes:
a first Al—Ti—Si layer formed at the Ti layer side; and
a second Al—Ti—Si layer formed at the aluminum member side and a Si concentration of which is lower than a Si concentration of the first Al—Ti—Si layer, and
wherein the metal layer includes:
an Al layer formed of the aluminum member and formed on the other surface of the insulation layer, and
a metal member layer formed on a surface of the Al layer that is opposite to a surface of the Al layer on which the insulation layer is formed, and formed of the metal member,
wherein in a bonding portion between the Al layer and the metal member layer, a Ti layer and an Al—Ti—Si layer are formed,
the Ti layer being disposed at the metal member layer side, and
the Al—Ti—Si layer being disposed between the Ti layer and the Al layer and containing Si which is solid-solubilized into $Al_3Ti$, and
wherein the Al—Ti—Si layer includes:
a first Al—Ti—Si layer formed at the Ti layer side; and
a second Al—Ti—Si layer formed at the Al layer side and a Si concentration of which is lower than a Si concentration of the first Al—Ti—Si layer.

15. A power module substrate comprising:
an insulation layer;
a circuit layer formed on one surface of the insulation layer; and
a metal layer formed on the other surface of the insulation layer,
wherein the metal layer is formed of the bonding body according to claim 11, and
wherein in a bonding portion between an Al layer formed of the aluminum member and a metal member layer formed of the metal member, a Ti layer and an Al—Ti—Si layer are formed,
the Ti layer being disposed at the metal member layer side, and
the Al—Ti—Si layer being disposed between the Ti layer and the Al layer and containing Si which is solid-solubilized into $Al_3Ti$, and
wherein the Al—Ti—Si layer includes:
a first Al—Ti—Si layer formed at the Ti side; and
a second Al—Ti—Si layer formed at the Al layer side and a Si concentration of which is lower than a Si concentration of the first Al—Ti—Si layer.

16. A heat-sink-attached power module substrate comprising:
the power module substrate according to claim 13, and
a heat sink bonded to the metal layer.

17. The heat-sink-attached power module substrate according to claim 16, wherein
the metal layer and the heat sink are bonded together through a solder layer.

18. A heat-sink-attached power module substrate comprising:
an insulation layer; and
a circuit layer formed on one surface of the insulation layer,
a metal layer formed on the other surface of the insulation layer, and
a heat sink bonded on the metal layer,
wherein the metal layer and the heat sink are formed of the bonding body according to claim 11,
wherein one of the metal layer and the heat sink of the bonding body is formed of aluminum, and the other of the metal layer and the heat sink of the bonding body is formed of any one of copper, nickel and silver, and
wherein in a bonding portion between the metal layer and the heat sink, a Ti layer and an Al—Ti—Si layer are formed,
the Ti layer being disposed at the metal layer side when the metal layer of the bonding body is formed of any one of copper, nickel and silver or being disposed at the heat sink side when the heat sink of the bonding body is formed of any one of copper, nickel and silver, and the Al—Ti—Si layer being disposed between the Ti layer and the metal layer when the metal layer of the bonding body is composed of aluminum or being disposed between the Ti layer and the heat sink when the heat sink of the bonding body is composed of aluminum, and containing Si which is solid-solubilized into $Al_3Ti$, and wherein the Al—Ti—Si layer includes:

a first Al—Ti—Si layer formed at the Ti side; and a second Al—Ti—Si layer formed at the metal layer side when the metal layer of the bonding body is composed of aluminum or formed at the heat sink side when the heat sink of the bonding body is composed of aluminum, and a Si concentration of which is lower than a Si concentration of the first Al—Ti—Si layer.

19. A heat-sink-attached power module substrate comprising:

the power module substrate according to claim 15, and a heat sink bonded to the metal layer.

20. The heat-sink-attached power module substrate according to claim 19, wherein the metal layer and the heat sink are bonded together through a solder layer.

* * * * *